United States Patent
Yuan et al.

(10) Patent No.: US 11,328,675 B2
(45) Date of Patent: May 10, 2022

(54) SHIFT REGISTER UNIT, DRIVING METHOD, GATE DRIVING CIRCUIT, AND DISPLAY DEVICE

(71) Applicants: HEFEI BOE JOINT TECHNOLOGY CO.,LTD., Anhui (CN); BOE Technology Group Co., Ltd., Beijing (CN)

(72) Inventors: Can Yuan, Beijing (CN); Yongqian Li, Beijing (CN); Zhidong Yuan, Beijing (CN); Min He, Beijing (CN); Haixia Xu, Beijing (CN)

(73) Assignees: Hefei BOE Joint Technology Co., LTD., Hefei (CN); BOE Technology Group Co., LTD., Beijing (CN)

( * ) Notice: Subject to any disclaimer, the term of this patent is extended or adjusted under 35 U.S.C. 154(b) by 0 days.

(21) Appl. No.: 17/256,049

(22) PCT Filed: Feb. 12, 2020

(86) PCT No.: PCT/CN2020/074922
§ 371 (c)(1),
(2) Date: Dec. 24, 2020

(87) PCT Pub. No.: WO2020/164525
PCT Pub. Date: Aug. 20, 2020

(65) Prior Publication Data
US 2021/0233476 A1  Jul. 29, 2021

(30) Foreign Application Priority Data
Feb. 13, 2019 (CN) .......................... 201910112669.2

(51) Int. Cl.
*G09G 3/3266* (2016.01)
*G11C 19/28* (2006.01)
*G09G 3/3233* (2016.01)

(52) U.S. Cl.
CPC .......... *G09G 3/3266* (2013.01); *G11C 19/28* (2013.01); *G09G 3/3233* (2013.01);
(Continued)

(58) Field of Classification Search
CPC ............... G09G 3/3266; G09G 3/3233; G09G 2300/0421; G09G 2310/0286;
(Continued)

(56) References Cited

U.S. PATENT DOCUMENTS

2007/0274433 A1\* 11/2007 Tobita .................. G09G 3/3677
377/64
2009/0085899 A1   4/2009 Ando et al.
(Continued)

FOREIGN PATENT DOCUMENTS

CN    101399002 A    4/2009
CN    104252843 A    12/2014
(Continued)

OTHER PUBLICATIONS

International search report of PCT application No. PCT/CN2020/074922 dated May 20, 2020.
(Continued)

*Primary Examiner* — Premal R Patel
(74) *Attorney, Agent, or Firm* — Fay Sharpe LLP

(57) ABSTRACT

A shift register unit, a driving method, a gate driving circuit, and a display device are disclosed. The shift register unit includes: a shift circuit, used to output, to a first output end during a first time period, a power control signal, and output the power control signal to a second output end during a second time period; and a signal integrated circuit, used to output the power control signal to a third output end in response to the power control signal and a first output signal, output the power control signal to the third output end in response to the power control signal and a second output
(Continued)

signal, and output, to the third output end at times other than the first and second time period in response to the power control signal, the first output signal and the second output signal, a first pull-down power signal.

20 Claims, 9 Drawing Sheets

(52) U.S. Cl.
CPC ........... *G09G 2300/0421* (2013.01); *G09G 2310/0286* (2013.01); *G09G 2310/08* (2013.01); *G09G 2330/02* (2013.01)

(58) Field of Classification Search
CPC .. G09G 2310/08; G09G 2330/02; G09G 3/20; G11C 19/28
See application file for complete search history.

(56) References Cited

U.S. PATENT DOCUMENTS

| | | | |
|---|---|---|---|
| 2016/0240265 | A1 | 8/2016 | Yu et al. |
| 2016/0253962 | A1 | 9/2016 | Li et al. |
| 2017/0287428 | A1* | 10/2017 | Xue ................. H01L 27/1214 |
| 2021/0082328 | A1 | 3/2021 | Feng et al. |

FOREIGN PATENT DOCUMENTS

| | | |
|---|---|---|
| CN | 105989811 A | 10/2016 |
| CN | 106531064 A | 3/2017 |
| CN | 108648716 A | 10/2018 |
| CN | 108648718 A | 10/2018 |
| CN | 108682398 A | 10/2018 |
| CN | 109616041 A | 4/2019 |
| JP | 2009047746 A | 3/2009 |

OTHER PUBLICATIONS

First office action of Chinese application No. 201910112669.2 dated Mar. 13, 2020.
Second office action of Chinese application No. 201910112669.2 dated Sep. 17, 2020.
Third office action of Chinese application No. 201910112669.2 dated Dec. 11, 2020.
Notification to grant patent right for invention of Chinese application No. 201910112669.2 dated Mar. 24, 2021.

* cited by examiner

| During a first stage, a potential of a power control signal provided by a power control end being a first potential, outputting, by a shift circuit, the power control signal to a first output end, and outputting, by a signal integrated circuit, the power control signal to a third output end in response to a first output signal provided by the first output end and the power control signal | 901 |

| During a second stage, the potential of the power control signal being the first potential, both a potential of the first output signal and a potential of a second output signal provided by a second output end being a second potential, outputting, by the signal integrated circuit to the third output end in response to the power control signal, the first output signal, and the second output signal, a first pull-down power signal which is from a first pull-down power end, and a potential of the first pull-down power signal is the second potential | 902 |

| During a third stage, the potential of the power control signal being the first potential, outputting, by the shift circuit, the power control signal to the second output end, and outputting, by the signal integrated circuit, the power control signal to the third output end in response to the second output signal and the power control signal | 903 |

SHIFT REGISTER UNIT, DRIVING METHOD, GATE DRIVING CIRCUIT, AND DISPLAY DEVICE

The present application is a 371 of PCT Patent Application Serial No. PCT/CN2020/074922, filed on Feb. 12, 2020, which claims the priority to Chinese Patent Application No. 201910112669.2, filed on Feb. 13, 2019, and entitled "SHIFT REGISTER UNIT, DRIVING METHOD, GATE DRIVING CIRCUIT, AND DISPLAY DEVICE", the entire contents of which are incorporated herein by reference.

TECHNICAL FIELD

The present disclosure relates to the field of display technologies, and in particular, to a shift register unit, a driving method, a gate driving circuit, and a display device.

BACKGROUND

Compared with traditional processes, the gate driver on array (Gate driver On Array, GOA) technology not only can omit a circuit board carrying a gate driver and implement a symmetrical design on both sides of a display panel, but also can omit a chip binding region on an edge of the display panel and a wiring region such as a fan-out region, thereby facilitating implementation of the narrow bezel design. In addition, the GOA technology can omit the chip binding process in a row direction, thereby greatly facilitating improvement of the overall production capacity and the overall yield.

SUMMARY

The present disclosure provides a shift register unit, a driving method, a gate driving circuit, and a display device, to resolve a prior-art problem of relatively low working reliability of a pixel circuit.

In one aspect, a shift register unit is provided, wherein the shift register unit includes: a shift circuit and a signal integrated circuit; wherein the shift circuit is respectively connected to a power control end, a first output end, and a second output end, the shift circuit is used to output, to the first output end during a first time period, a power control signal from the power control end, and the shift circuit is further used to output the power control signal to the second output end during a second time period different from the first time period;

the signal integrated circuit is respectively connected to the power control end, the first output end, the second output end, a first pull-down power end, and a third output end;

the signal integrated circuit is used to output the power control signal to the third output end in response to the power control signal and a first output signal which is provided by the first output end;

the signal integrated circuit is further used to output the power control signal to the third output end in response to the power control signal and a second output signal which is provided by the second output end; and the signal integrated circuit is further used to output, to the third output end at times other than the first time period and the second time period in response to the power control signal, the first output signal, and the second output signal, a first pull-down power signal which is from the first pull-down power end.

Optionally, the first time period is an output time period of a gate driving signal during a display scan time period, and the second time period is an output time period of a sensing scan signal during a blank time period.

Optionally, the signal integrated circuit includes: a first input subcircuit, a first output subcircuit, a second input subcircuit, a second output subcircuit, a pull-down control subcircuit, and a pull-down subcircuit;

the first input subcircuit is respectively connected to the power control end and a first node, and is used to output the power control signal to the first node in response to the power control signal;

the first output subcircuit is respectively connected to the first node, the power control end, the first output end, and the third output end, and is used to output the power control signal to the third output end in response to a potential of the first node and the first output signal;

the second input subcircuit is respectively connected to the power control end and a second node, and is used to output the power control signal to the second node in response to the power control signal;

the second output subcircuit is respectively connected to the second node, the power control end, the second output end, and the third output end, and is used to output the power control signal to the third output end in response to a potential of the second node and the second output signal;

the pull-down control subcircuit is respectively connected to the power control end, a third node, the first output end, the second output end, and a second pull-down power end, is used to output, to the third node in response to at least one of the first output signal and the second output signal, a second pull-down power signal which is from the second pull-down power end, and is used to output the power control signal to the third node in response to the power control signal; and the pull-down subcircuit is respectively connected to the third node, the first pull-down power end, and the third output end, and is used to output the first pull-down power signal to the third output end in response to a potential of the third node.

Optionally, the first input subcircuit includes a first input transistor; the first output subcircuit includes: a first output transistor, a second output transistor, and a first capacitor; the second input subcircuit includes a second input transistor; the second output subcircuit includes: a third output transistor, a fourth output transistor, and a second capacitor;

both a gate and a first electrode of the first input transistor are connected to the power control end, and a second electrode of the first input transistor is connected to the first node;

a gate of the first output transistor is connected to the first output end, a first electrode of the first output transistor is connected to the power control end, and a second electrode of the first output transistor is connected to a first electrode of the second output transistor;

a gate of the second output transistor is connected to the first node, and a second electrode of the second output transistor is connected to the third output end;

one end of the first capacitor is connected to the first node, and the other end of the first capacitor is connected to the third output end;

both a gate and a first electrode of the second input transistor are connected to the power control end, and a second electrode of the second input transistor is connected to the second node;

a gate of the third output transistor is connected to the second output end, a first electrode of the third output transistor is connected to the power control end, and a second electrode of the third output transistor is connected to a first electrode of the fourth output transistor;

a gate of the fourth output transistor is connected to the second node, and a second electrode of the fourth output transistor is connected to the third output end; and one end of the second capacitor is connected to the second node, and the other end of the second capacitor is connected to the third output end.

Optionally, the second input transistor and the first input transistor are the same transistor, the second output transistor and the fourth output transistor are the same transistor, and the second capacitor and the first capacitor are the same capacitor.

Optionally, the power control end includes a first power end and a second power end, and a potential of a first power signal provided by the first power end is complementary to a potential of a second power signal provided by the second power end;

the first input subcircuit is respectively connected to the first power end and the first node, and is used to output the first power signal to the first node in response to the first power signal provided by the first power end; the first output subcircuit is respectively connected to the first power end, the first node, the first output end, and the third output end, and is used to output the first power signal to the third output end in response to the potential of the first node and the first output signal; and the second input subcircuit is respectively connected to the second power end and the second node, and is used to output the second power signal to the second node in response to the second power signal provided by the second power end, the second output subcircuit is respectively connected to the second power end, the second node, the second output end, and the third output end, and is used to output the second power signal to the third output end in response to the potential of the second node and the second output signal.

Optionally, both the gate and the first electrode of the first input transistor are connected to the first power end, and the second electrode of the first input transistor is connected to the first node;

both the gate and the first electrode of the second input transistor are both connected to the second power end, and the second electrode of the second input transistor is connected to the second node;

the first output subcircuit further includes a fifth output transistor, and the second output subcircuit further includes a sixth output transistor;

both a gate and a first electrode of the fifth output transistor are connected to the first power end, and a second electrode of the fifth output transistor is connected to the first electrode of the first output transistor; and both a gate and a first electrode of the sixth output transistor are both connected to the second power end, and a second electrode of the sixth output transistor is connected to the first electrode of the third output transistor.

Optionally, the shift circuit includes a first shift subcircuit and a second shift subcircuit; the first shift subcircuit is respectively connected to the power control end, the first output end, and a first reversed phase output end, the first shift subcircuit is used to output the power control signal to the first output end during the first time period, and output the power control signal to the first reversed phase output end at times other than the first time period; the second shift subcircuit is respectively connected to the power control end, the second output end, and a second reversed phase output end, and the second shift subcircuit is used to output the power control signal to the second output end during the second time period, and output the power control signal to the second reversed phase output end at times other than the second time period;

the signal integrated circuit includes: a first input subcircuit, a first output subcircuit, a second input subcircuit, a second output subcircuit, a pull-down control subcircuit, and a pull-down subcircuit; the first input subcircuit is respectively connected to the power control end and a first node, and is used to output the power control signal to the first node in response to the power control signal;

the first output subcircuit is respectively connected to the first node, the power control end, the first output end, and the third output end, and is used to output the power control signal to the third output end in response to a potential of the first node and the first output signal;

the second input subcircuit is respectively connected to the power control end and a second node, and is used to output the power control signal to the second node in response to the power control signal;

the second output subcircuit is respectively connected to the second node, the power control end, the second output end, and the third output end, and is used to output the power control signal to the third output end in response to a potential of the second node and the second output signal; and the pull-down control subcircuit is respectively connected to the first reversed phase output end, the second reversed phase output end and a fourth node, and is used to output the power control signal to the fourth node when both the first reversed phase output end and the second reversed phase output end output the power control signal.

the pull-down subcircuit is respectively connected to the fourth node, the first pull-down power end, and the third output end, and is used to output the first pull-down power signal to the third output end in response to a potential of the fourth node.

Optionally, the third output end is connected to one gate line, such that the shift register unit outputs a driving signal to the gate line.

In another aspect, a method for driving a shift register unit is provided, applied to the shift register unit according to the foregoing aspect, wherein the method includes:

during a first stage, a potential of a power control signal provided by a power control end being a first potential, outputting, by a shift circuit, the power control signal to a first output end, and outputting, by a signal integrated circuit, the power control signal to a third output end in response to a first output signal provided by the first output end and the power control signal;

during a second stage, the potential of the power control signal being the first potential, both a potential of the first output signal and a potential of a second output signal provided by a second output end being a second potential, outputting, by the signal integrated circuit to the third output end in response to the power control signal, the first output signal, and the second output signal, a first pull-down power signal which is from a first pull-down power end, wherein a potential of the first pull-down power signal is the second potential; and during a third stage, the potential of the power control signal being the first potential, outputting, by the shift circuit, the power control signal to the second output end, and outputting, by the signal integrated circuit, the power control signal to the third output end in response to the second output signal and the power control signal.

In still another aspect, a gate driving circuit is provided, wherein the gate driving circuit includes: at least two cascaded shift register units according to the foregoing aspect; and a third output end of each level of shift register unit other than a final level is connected to an input signal end of a next level of shift register unit, and a third output end of each level of shift register unit other than a first level is connected to a reset signal end of a previous level of shift register unit.

In yet another aspect, a display device is provided, wherein the display device includes: the gate driving circuit according to the foregoing aspect.

BRIEF DESCRIPTION OF THE DRAWINGS

FIG. 10 is a flowchart of a method for driving a shift register unit according to an embodiment of the present disclosure;

DETAILED DESCRIPTION

Figure 1:
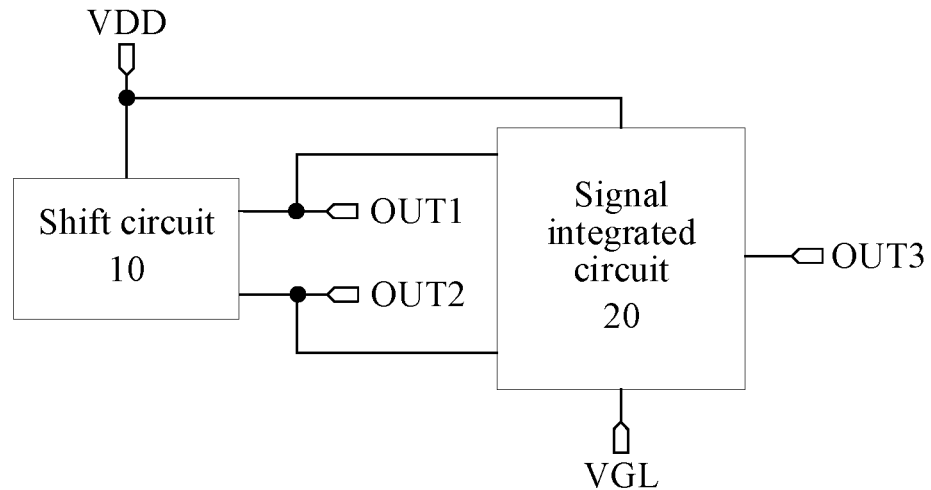
FIG. 1 is a schematic structural diagram of a shift register unit according to an embodiment of the present disclosure.

To make the purpose, technical solutions, and advantages of the present disclosure clearer, the implementations of the present disclosure are further described below in detail with reference to the accompanying drawings.

To help reader to understand, related devices in circuits used in the embodiments of the present disclosure are first described. All transistors used in all the embodiments of the present disclosure may be thin film transistors or field-effect transistors or other devices with same characteristics, and the transistors used in the embodiments of the present disclosure are mainly switching transistors according to effects in the circuits. Because sources and drains of the switching transistors used herein are symmetrical, the sources and the drains may be interchanged. In the embodiments of the present disclosure, a source is referred to as a first electrode, and a drain is referred to as a second electrode. According to forms in the accompanying drawings, an intermediate end of a transistor is a gate, a signal input end is a source, and an output end is a drain. In addition, a switching transistor used in the embodiments of the present disclosure may include either of a P-type switching transistor and an N-type switching transistor. The P-type switching transistor is conducted when a gate is at a low level, and is cut off when the gate is at a high level. The N-type switching transistor is conducted when a gate is at a high level, and is cut off when the gate is at a low level. In addition, each of a plurality of signals in the various embodiments of the present disclosure corresponds to a first potential and a second potential. The first potential and the second potential only represent that a potential of the signal has two different status parameters, and do not represent that the potential of the signal has specific values.

In related art, a display device usually includes: a pixel circuit and a shift register unit used to provide a driving signal to the pixel circuit. The pixel circuit usually includes: a driving transistor, and a switching transistor and a detection transistor that are connected to the same gate line. An output end of the shift register unit may be connected to the gate line, and outputs a driving signal to the gate line. Then the switching transistor may drive, under control of a gate signal (in other words, the driving signal) output by the gate line, a light emitting unit connected to the switching transistor to emit light. The detection transistor may detect a voltage of the light emitting unit under control of the gate signal, and perform external compensation on a threshold voltage of the driving transistor based on the detected voltage, to ensure a display effect of the display device.

In related art, each shift register unit may include: an input circuit, an output circuit, and a pull-down circuit. The output circuit of each shift register unit may be connected to two output ends, and output signals at different potentials to the two output ends at different working stages. Alternatively, each of output circuits of two shift register units may be respectively connected to one output end, and output, at different working stages, signals at different potentials to the output ends connected to the output circuits. The two output ends may be connected to the same gate line, and the gate line may control working of the pixel circuit based on driving signals output by the two output ends.

However, in related art, the two output ends need to respectively output the driving signals at the different potentials to the same gate line, to control working of the pixel circuit. Therefore, signals on the gate line may be disturbed. Consequently, working reliability of the pixel circuit is relatively low. FIG. 1 is a schematic structural diagram of a shift register unit according to an embodiment of the present disclosure. As shown in FIG. 1, the shift register unit may include: a shift circuit 10 and a signal integrated circuit 20.

The shift circuit 10 may be respectively connected to a power control end VDD, a first output end OUT1, and a second output end OUT2. The shift circuit 10 may output, to the first output end OUT1 during an output time period of a gate driving signal in a display scan time period (in other words, a stage at which a display device displays an image), a power control signal which is from the power control end VDD. In addition, the shift circuit 10 may further output the power control signal to the second output end OUT2 during an output time period of a sensing scan signal during a blank time period (a stage from a time when the pixel circuit drives a row of pixels to complete scanning to a time when the pixel circuit drives a next row of pixels to start scanning, or a stage from a time when the pixel circuit drives a frame of image to be completely displayed to a time when the pixel circuit drives a next frame of image to start to be displayed). A potential of the power control signal may be a first potential. In this embodiment of the present disclosure, the first potential may be an effective potential (the effective potential is a potential which is used to control a transistor included in the shift register unit to be turned on, to enable the shift register unit to work).

The signal integrated circuit 20 may be respectively connected to the power control end VDD, the first output end OUT1, the second output end OUT2, a first pull-down power end VGL, and a third output end OUT3. The signal integrated circuit 20 may output the power control signal to the third output end OUT3 in response to the power control signal provided by the power control end VDD and a first output signal provided by the first output end OUT1.

The signal integrated circuit 20 may further output the power control signal to the third output end OUT3 in response to the power control signal and a second output signal which is provided by the second output end OUT2.

The signal integrated circuit 20 may further output, to the third output end OUT3 at times other than a first time period and a second time period in response to the power control signal, the first output signal, and the second output signal, a first pull-down power signal which is from the first pull-down power end VGL. The third output end OUT3 may be connected to one gate line (not shown in FIG. 1), and is used to output a driving signal to the gate line, in other words, is used to output, to the gate line, the power control signal output by the shift circuit 10 to the first output end OUT1 and the power control signal output by the shift circuit 10 to the second output end OUT2.

Exemplarily, the signal integrated circuit 20 may output the power control signal to the third output end OUT3 when a potential of the first output signal provided by the first output end OUT1 is the first potential (in other words, when the shift circuit 10 outputs the power control signal to the first output end OUT1). In other words, the signal integrated circuit 20 may output, to the third output end OUT3, the first output signal output by the shift circuit 10 to the first output end OUT1. The signal integrated circuit 20 may output the power control signal to the third output end OUT3 when a potential of the second output signal provided by the second output end OUT2 is the first potential (in other words, when the shift circuit 10 outputs the power control signal to the second output end OUT2). In other words, the signal integrated circuit 20 may output, to the third output end OUT3, the second output signal output by the shift circuit 10 to the second output end OUT2.

The signal integrated circuit 20 is used to output, to the same third output end OUT3, the power control signal output by the shift circuit 10 to the first output end OUT1 during the output time period of the gate driving signal, and the power control signal output by the shift circuit 10 to the second output end OUT2 during the output time period of the sensing scan signal, such that the first output signal and the second output signal may be integrated. Because the third output end OUT3 is connected to one gate line of the drive pixel circuit, the gate line may be enabled to reliably drive, under control of a third output signal provided by the third output end OUT3, the pixel circuit connected to the gate line to work, thereby improving working reliability of the pixel circuit.

In addition, when both the potential of the first output signal and the potential of the second output signal are a second potential, under control of the power control signal, the first output signal, and the second output signal, the signal integrated circuit 20 may further output, to the third output end OUT3, a first pull-down power signal which is from the first pull-down power signal end VGL. A potential of the first pull-down power signal may be the second potential. In this embodiment of the present disclosure, the second potential may be an ineffective potential (the ineffective potential is a potential which is used to control a transistor included in the shift register unit to be turned off, to enable the shift register unit to stop working), and the second potential may be a low potential compared with the first potential.

In summary, this embodiment of the present disclosure provides the shift register unit. The shift register unit includes the shift circuit and the signal integrated circuit. The shift circuit may respectively output the power control signal to the first output end and the second output end during the output time period of the gate driving signal during the display scan time period and the output time period of the sensing scan signal during the blank time period. Therefore, the shift circuit may output, to the third output end, a signal integrating the gate driving signal and the sensing scan signal, to implement display and external compensation (for example, a threshold voltage is compensated for by sensing an anode voltage of an organic light emitting diode) functions. In addition, the signal integrated circuit may output the power control signal to the third output end under control of the power control signal and the first output signal which is provided by the first output end, and may output the power control signal to the third output end under control of the power control signal and the second output signal which is provided by the second output end. Therefore, the first output signal and the second output signal may be integrated and output to the third output end, and the third output end outputs an integration signal to one gate line of the drive pixel circuit, thereby ensuring working reliability of the pixel circuit while ensuring external compensation.

It should be noted that other driving signals that need to be integrated may also be integrated with reference to the foregoing manner. For example, a first driving signal is a power control signal only during the first time period, and a second driving signal is a power control signal only during the second time period. In this case, the shift circuit may output, to the first output end during the first time period, the power control signal which is from the power control end, and output the power control signal to the second output end during the second time period, to integrate the first driving signal and the second driving signal.

Figure 2:
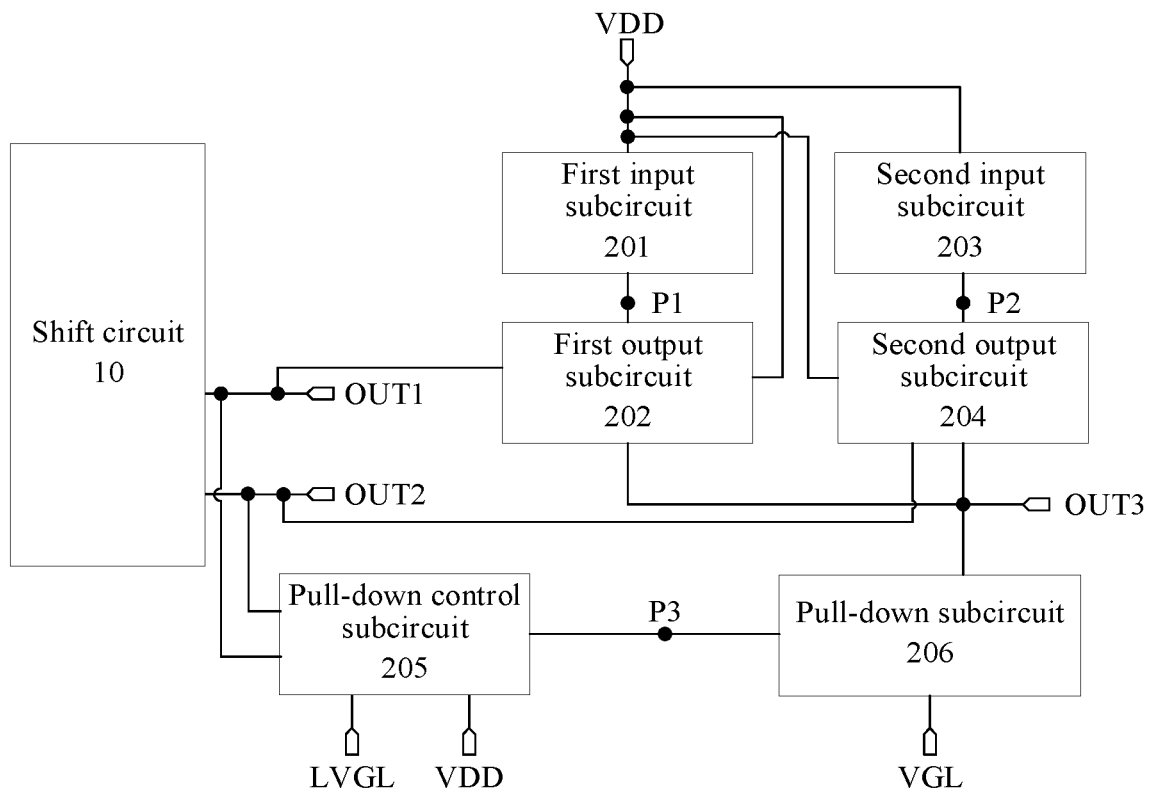
FIG. 2 is a schematic structural diagram of another shift register unit according to an embodiment of the present disclosure.

FIG. 2 is a schematic structural diagram of another shift register unit according to an embodiment of the present disclosure. As shown in FIG. 2, the signal integrated circuit may include: a first input subcircuit 201, a first output subcircuit 202, a second input subcircuit 203, a second output subcircuit 204, a pull-down control subcircuit 205, and a pull-down subcircuit 206.

Referring to FIG. 2, the first input subcircuit 201 may be respectively connected to a power control end VDD and a first node P1. The first input subcircuit 201 may output a power control signal to the first node P1 in response to the power control signal.

Exemplarily, a potential of the power control signal is a first potential, and the first input subcircuit 201 may output the power control signal at the first potential to the first node P1 under control of the power control signal, to charge the first node P1.

The first output subcircuit 202 may be respectively connected to the first node P1, the power control end VDD, a first output end OUT1, and a third output end OUT3. The first output subcircuit 202 may output the power control signal to the third output end OUT3 in response to a potential of the first node P1 and a first output signal.

Exemplarily, the first output subcircuit 202 may output the power control signal to the third output end OUT3 when both the potential of the first node P1 and a potential of the first output signal are the first potential (in other words, when a shift circuit 10 outputs the power control signal at the first potential to the first output end OUT1).

The second input subcircuit 203 may be respectively connected to the power control end VDD and a second node P2. The second input subcircuit 203 may output the power control signal to the second node P2 in response to the power control signal.

Exemplarily, a potential of the power control signal is the first potential, and the second input subcircuit 203 may output the power control signal at the first potential to the second node P2 under control of the power control signal, to charge the second node P2.

The second output subcircuit 204 may be respectively connected to the second node P2, the power control end VDD, a second output end OUT2, and the third output end OUT3. The second output subcircuit 204 may output the power control signal to the third output end OUT3 in response to a potential of the second node P2 and a second output signal.

Exemplarily, the second output subcircuit 204 may output the power control signal to the third output end OUT3 when both a potential of the second node P2 and a potential of the second output signal are the first potential (in other words, when the shift circuit 10 outputs the power control signal at the first potential to the second output end OUT2).

The pull-down control subcircuit 205 may be respectively connected to the power control end VDD, a third node P3, the first output end OUT1, the second output end OUT2, and a second pull-down power end LVGL. The pull-down control subcircuit 205 may output, to the third node P3 in response to the first output signal or the second output signal, a second pull-down power signal which is from the second pull-down power end LVGL. The pull-down control subcircuit 205 may further output the power control signal to the third node P3 in response to the power control signal.

Exemplarily, the pull-down control subcircuit 205 may output, to the third node P3 when the potential of the first output signal or the potential of the second output signal is the first potential (in other words, when the shift circuit 10 outputs the power control signal at the first potential to the first output end OUT1, or outputs the power control signal at the first potential to the second output end OUT2), a second pull-down power signal which is from the second pull-down power end LVGL. A potential of the second pull-down power signal is a third potential. In addition, when both the potential of the first output signal and the potential of the second output signal are the second potential, under control of the power control signal, the pull-down control subcircuit 205 may further output the power control signal at the first potential to the third node P3.

Referring to FIG. 2, the pull-down subcircuit 206 may be respectively connected to the third node P3, a first pull-down power end VGL, and the third output end OUT3. The pull-down subcircuit 206 may output a first pull-down power signal to the third output end OUT3 in response to a potential of the third node P3.

Exemplarily, the pull-down subcircuit 206 may output the first pull-down power signal at the second potential to the third output end OUT3 when the potential of the third node P3 is the first potential, to reset the third output end OUT3.

It should be noted that, in this embodiment of the present disclosure, the potential (in other words, the third potential) of the second pull-down power signal provided by the second pull-down power end LVGL is a low potential compared with a potential (in other words, the second potential) of the first pull-down power signal provided by the first pull-down power end VGL. The second pull-down power signal at the lower potential is output to the third node P3, such that it can be ensured that the pull-down subcircuit 206 is not wrongly turned on under control of the third node P3, thereby avoiding a failure to effectively resetting the third output end OUT3 caused by wrongly turning on the pull-down subcircuit 206. In this way, working reliability of the shift register unit is further effectively ensured.

Figure 3:
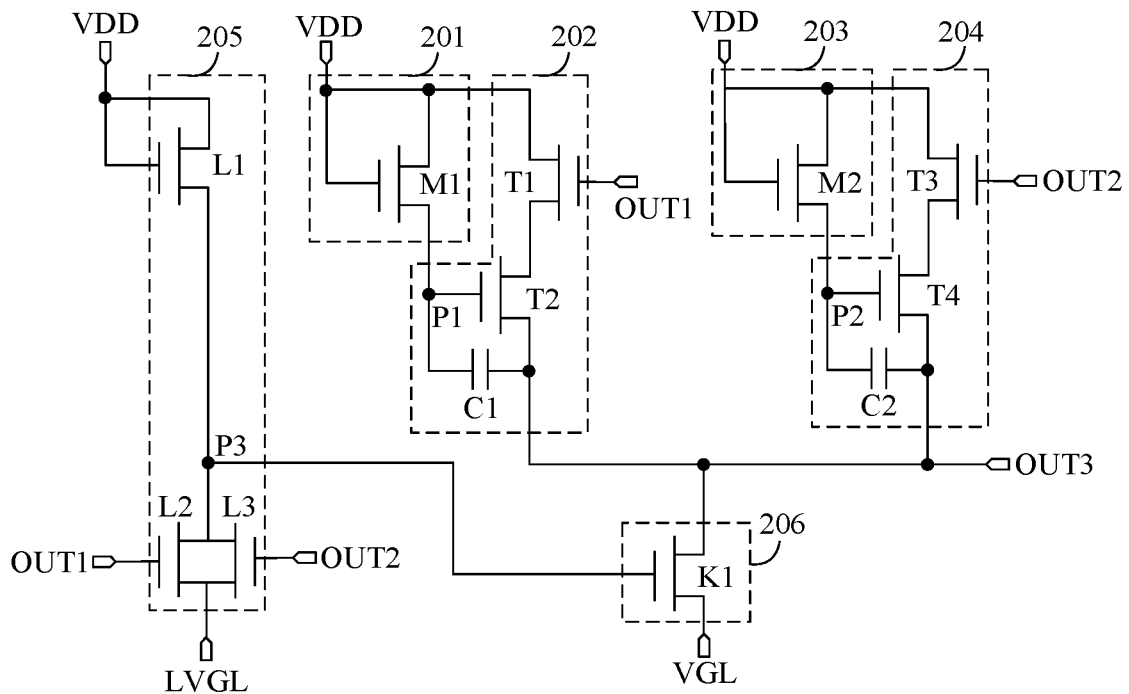
FIG. 3 is a schematic structural diagram of still another shift register unit according to an embodiment of the present disclosure.

FIG. 3 is a schematic structural diagram of still another shift register unit according to an embodiment of the present disclosure. As shown in FIG. 3, the first input subcircuit 201 may include a first input transistor M1. The first output subcircuit 202 may include: a first output transistor T1, a second output transistor T2, and a first capacitor C1. The second input subcircuit 203 may include a second input transistor M2. The second output subcircuit 204 may include: a third output transistor T3, a fourth output transistor T4, and a second capacitor C2.

As shown in FIG. 3, both a gate and a first electrode of the first input transistor M1 may be connected to a power control end VDD, and a second electrode of the first input transistor M1 may be connected to a first node P1.

A gate of the first output transistor T1 may be connected to a first output end OUT1, a first electrode of the first output transistor T1 may be connected to the power control end VDD, and a second electrode of the first output transistor T1 may be connected to a first electrode of the second output transistor T2.

A gate of the second output transistor T2 may be connected to the first node P1, and a second electrode of the second output transistor T2 may be connected to a third output end OUT3.

One end of the first capacitor C1 may be connected to the first node P1, and the other end of the first capacitor C1 may be connected to the third output end OUT3.

Both a gate and a first electrode of the second input transistor M2 may be connected to the power control end VDD, and a second electrode of the second input transistor M2 may be connected to a second node P2.

A gate of the third output transistor T3 may be connected to a second output end OUT2, a first electrode of the third output transistor T3 may be connected to the power control end VDD, and a second electrode of the third output transistor T3 may be connected to a first electrode of the fourth output transistor T4.

A gate of the fourth output transistor T4 may be connected to the second node P2, and a second electrode of the fourth output transistor T4 may be connected to the third output end OUT3.

One end of the second capacitor C2 may be connected to the second node P2, and the other end of the second capacitor C2 may be connected to the third output end OUT3.

The first capacitor C1 may be disposed, such that a potential of the first node P1 may be further pulled up based on a self-boost function of the first capacitor C1 when a potential of the third output end OUT3 is a first potential, thereby ensuring that the second output transistor T2 can be fully turned on. Correspondingly, a threshold voltage Vth of the second output transistor T2 is prevented from affecting a signal output by the second output transistor T2, such that the second output transistor T2 may losslessly output a power control signal to the third output end OUT3, in other words, the power control signal output by the second output transistor T2 to the third output end OUT3 is not lost due to impact of the threshold voltage, thereby ensuring reliability of the signal output by the second output transistor T2 to the third output end OUT3.

Likewise, the second capacitor C2 may be disposed, such that a potential of the second node P2 may be further pulled up based on a self-boost function of the second capacitor C2 when the potential of the third output end OUT3 is the first potential, thereby ensuring that the fourth output transistor T4 can be fully turned on. Correspondingly, a threshold voltage Vth of the fourth output transistor T4 is prevented from affecting a signal output by the fourth output transistor T4, such that the fourth output transistor T4 may losslessly output a power control signal to the third output end OUT3, in other words, the power control signal output by the fourth output transistor T4 to the third output end OUT3 is not lost due to impact of the threshold voltage, thereby ensuring reliability of the signal output by the fourth output transistor T4 to the third output end OUT3.

The self-boost function means that the capacitor pulls up a voltage at the other end by using a voltage at one end based on a characteristic that a voltage difference at the two ends of the capacitor cannot suddenly change. That is, when the voltage at one end of the capacitor increases, since the voltage difference between the two ends of the capacitor remains unchanged, the voltage at the other end can also be pulled up accordingly.

Optionally, both the gate of the first input transistor M1 and the gate of the second input transistor M2 are connected to the same signal end, both the first electrode of the first input transistor M1 and the first electrode of the second input transistor M2 are connected to the same signal end, both the second electrode of the first input transistor M1 and the second electrode of the second input transistor M2 are connected to the same signal end, both the gate of the second output transistor T2 and the gate of the fourth output transistor T4 are connected to the same signal end, the second electrode of the second output transistor T2 and the second electrode of the fourth output transistor T4 are connected to the same signal end, and the two ends of the first capacitor C1 and the two ends of the second capacitor C2 are all connected to the same signal end. Therefore, in this embodiment of the present disclosure, as shown in FIG. 3, the second input transistor M2 may multiplex the first input transistor M1, the second output transistor T2 may multiplex the fourth output transistor T4, and the second capacitor C2 may multiplex the first capacitor C1.

Figure 4:
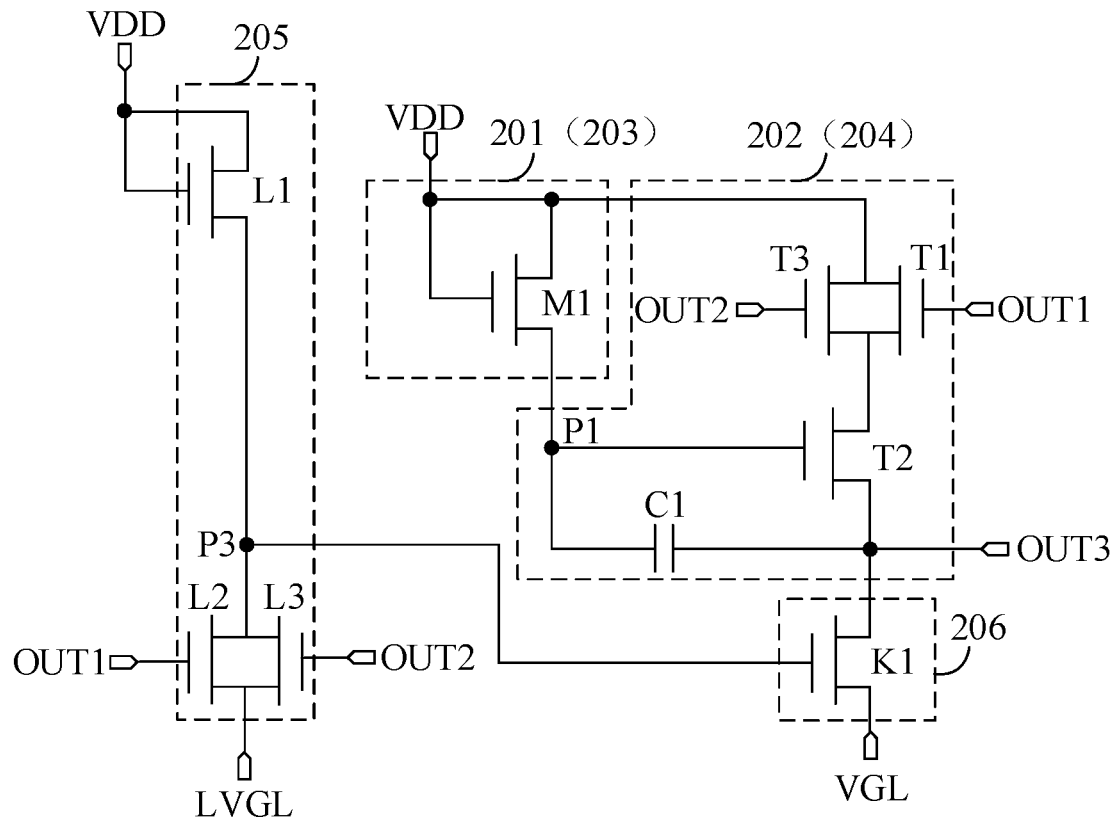
FIG. 4 is a schematic structural diagram of yet another shift register unit according to an embodiment of the present disclosure.

Exemplarily, FIG. 4 is a schematic structural diagram of yet another shift register unit according to an embodiment of the present disclosure. As shown in FIG. 4, the first input subcircuit 201 and the second input subcircuit 203 may share one input transistor, such as the first input transistor M1 shown in FIG. 4. The first output subcircuit 202 and the second output subcircuit 204 may share one output transistor and one capacitor, such as the second output transistor T2 and the first capacitor C1 that are shown in FIG. 4. Correspondingly, the first node P1 and the second node P2 are the same node (such as the first node P1 shown in FIG. 4).

Signal integration may be implemented by multiplexing a transistor, thereby reducing a quantity of used transistors while reliable working of a pixel circuit is ensured. For example, compared with the shift register unit in FIG. 3, two transistors and one capacitor are omitted in the shift register unit in FIG. 4. In this way, a structure of the signal integrated circuit 20 may be simplified, thereby reducing manufacturing costs, providing technical support for mass production, and further facilitating implementation of a narrow-bezel display panel.

Figure 5:
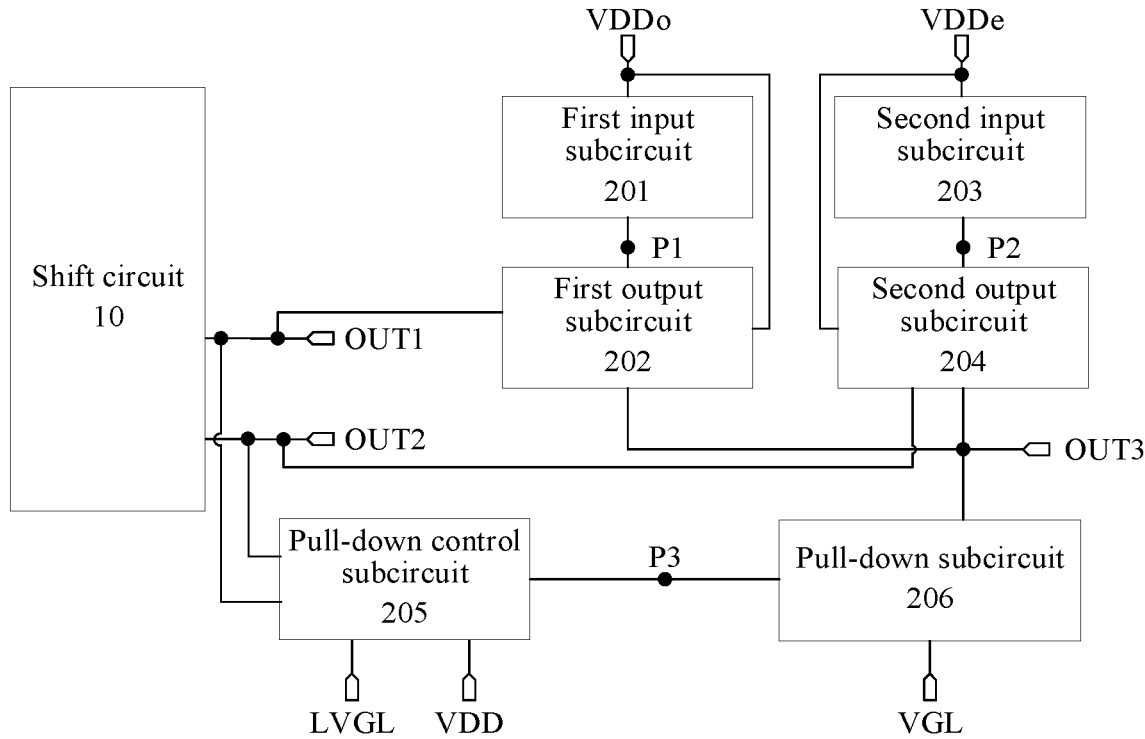
FIG. 5 is a schematic structural diagram of yet another shift register unit according to an embodiment of the present disclosure.

Optionally, FIG. 5 is a schematic structural diagram of yet another shift register unit according to an embodiment of the present disclosure. As shown in FIG. 5, the power control end VDD may include a first power end VDDo and a second power end VDDe. A potential of a first power signal provided by the first power end VDDo and a potential of a second power signal provided by the second power end VDDe complement each other. In other words, when the potential of the first power signal is a first potential, the potential of the second power signal is a second potential; when the potential of the first power signal is the second potential, the potential of the second power signal is the first potential.

Correspondingly, referring to FIG. 5, the first input subcircuit 201 may be respectively connected to the first power end VDDo and a first node P1. The first input subcircuit 201 may output the first power signal to the first node P1 in response to the first power signal provided by the first power end VDDo.

Exemplarily, the first input subcircuit 201 may output the first power signal to the first node P1 when the potential of the first power signal is the first potential, to charge the first node P1.

The first output subcircuit 202 may be respectively connected to the first power end VDDo, the first node P1, a first output end OUT1, and a third output end OUT3. The first output subcircuit 202 may output the first power signal to the third output end OUT3 in response to a potential of the first node P1 and a first output signal.

Exemplarily, the first output subcircuit 202 may output the first power signal to the third output end OUT3 when both the potential of the first power signal and a potential of the first output signal are the first potential (in other words, when a shift circuit 10 outputs the first power signal at the first potential to the first output end OUT1).

The second input subcircuit 203 may be respectively connected to the second power end VDDe and a second node P2. The second input subcircuit 203 may output a second power signal to the second node P2 in response to the second power signal provided by the second power end VDDe.

Exemplarily, the second input subcircuit 203 may output the second power signal to the second node P2 when a potential of the second power signal is the first potential, to charge the second node P2.

The second output subcircuit 204 may be respectively connected to the second power end VDDe, the second node P2, a second output end OUT2, and the third output end OUT3. The second output subcircuit 204 may output the second power signal to the third output end OUT3 in response to a potential of the second node P2 and a second output signal.

Exemplarily, the second output subcircuit 204 may output the second power signal to the third output end OUT3 when both a potential of the second power signal and a potential of the second output signal are the first potential (in other words, when the shift circuit 10 outputs the second power signal at the first potential to the second output end OUT2).

Two power ends (the first power end VDDo and the second power end VDDe) whose output potentials are complementary are disposed, to respectively control the potential of the first node P1 and the potential of the second node P2, such that a gate bias voltage of the first input transistor M1 and a gate bias voltage of the second input transistor M2 may be reduced, and deviation occurring on a threshold voltage Vth of a first input transistor M1 and deviation occurring on a threshold voltage Vth of a second input transistor M2 are reduced, thereby improving working reliability of the shift register unit. In addition, a relatively short service life when the first input transistor M1 and the second input transistor M2 are in a turned-on state for a long time under control of the power control signal at the first potential may be further avoided, thereby improving working reliability of the shift register unit.

Optionally, both a jump time of the potential of the first power signal and a jump time of the potential of the second power signal may be less than or equal to a time threshold.

Exemplarily, assuming that the time threshold is 3 seconds (s), and both the jump time of the potential of the first power signal and the jump time of the potential of the second power signal are equal to the time threshold, both the potential of the first power signal and the potential of the second power signal may jump once every 3 s.

Figure 6:
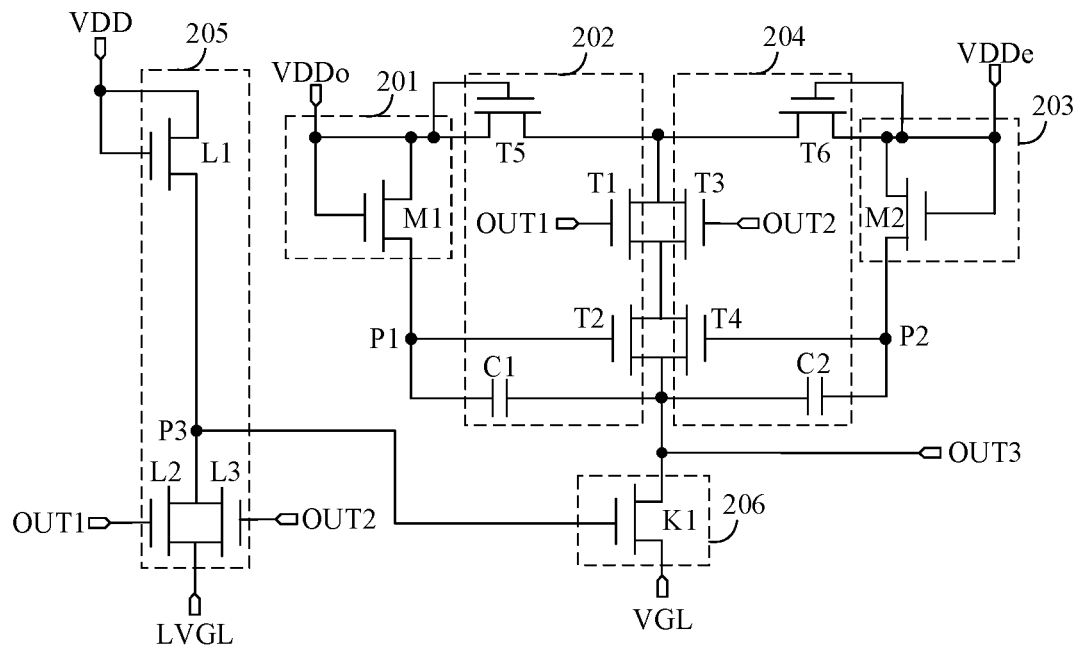
FIG. 6 is a schematic structural diagram of yet another shift register unit according to an embodiment of the present disclosure.

Correspondingly, FIG. 6 is a schematic structural diagram of yet another shift register unit according to an embodiment of the present disclosure. As shown in FIG. 6, the first output subcircuit 202 may further include a fifth output transistor T5, and the second output subcircuit 204 may further include a sixth output transistor T6.

Referring to FIG. 6, both a gate and a first electrode of a first input transistor M1 may be connected to a first power end VDDo, and a second electrode of the first input transistor M1 may be connected to a first node P1.

Both a gate and a first electrode of a second input transistor M2 may be connected to a second power end VDDe, and a second electrode of the second input transistor M2 may be connected to a second node P2.

Both a gate and a first electrode of the fifth output transistor T5 may be connected to the first power end VDDo, and a second electrode of the fifth output transistor T5 may be connected to a first electrode of a first output transistor T1.

Both a gate and a first electrode of the sixth output transistor T6 may be connected to the second power end VDDe, and a second electrode of the sixth output transistor T6 may be connected to a first electrode of a third output transistor T3.

Referring to FIG. 6, it may be seen that the first electrode of the first output transistor T1 and the first electrode of the third output transistor T3 are extracted by using one node. Therefore, the fifth output transistor T5 is disposed to output, to the first electrode of the first output transistor T1, a first power signal provided by the first power end VDDo, and the sixth output transistor T6 is disposed to output, to the first electrode of the third output transistor T3, a second power signal provided by the second power end VDDe, such that mutual short-circuiting between the first power end VDDo and the second power end VDDe may be avoided, thereby ensuring working reliability of a signal integrated circuit 20, and further ensuring working reliability of the shift register unit.

Optionally, referring to FIG. 3, FIG. 4, and FIG. 6, it may be further seen that, the pull-down control subcircuit 205 may include: a first pull-down control transistor L1, a second pull-down control transistor L2, and a third pull-down control transistor L3. The pull-down subcircuit 206 may include a pull-down transistor K1.

Both a gate and a first electrode of the first pull-down control transistor L1 may be connected to the power control end VDD, and a second electrode of the first pull-down control transistor L1 may be connected to the third node P3.

A gate of the second pull-down control transistor L2 may be connected to the first output end OUT1, and a gate of the third pull-down control transistor L3 may be connected to the second output end OUT2. Both a first electrode of the second pull-down control transistor L2 and a first electrode of the third pull-down control transistor L3 may be connected to the second pull-down power end LVGL. Both a second electrode of the second pull-down control transistor L2 and a second electrode of the third pull-down control transistor L3 may be connected to the third node P3.

A gate of the pull-down transistor K1 may be connected to the third node P3, a first electrode of the pull-down transistor K1 may be connected to the first pull-down power end VGL, and a second electrode of the pull-down transistor K1 may be connected to the third output end OUT3.

Figure 7:
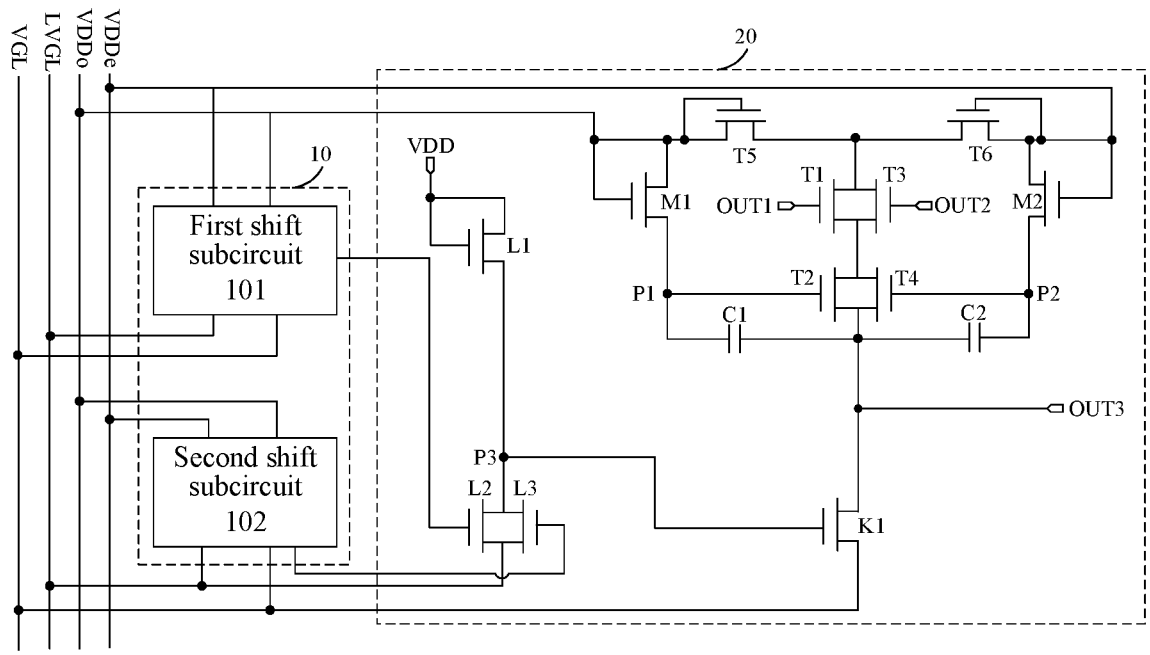
FIG. 7 is a schematic structural diagram of yet another shift register unit according to an embodiment of the present disclosure.

FIG. 7 is a schematic structural diagram of yet another shift register unit according to an embodiment of the present disclosure. As shown in FIG. 7, the shift circuit 10 may include: a first shift subcircuit 101 and a second shift subcircuit 102.

The first shift subcircuit 101 may be respectively connected to a power control end VDD and a first output end OUT1. The first shift subcircuit 101 may output, to the first output end OUT1 during an output time period of the foregoing gate driving signal, a power control signal which is from the power control end VDD. The second shift subcircuit 102 may be respectively connected to the power control end VDD and a second output end OUT2. The second shift subcircuit 102 may output, to the second output end OUT2 during an output time period of the foregoing sensing scan signal, the power control signal which is from the power control end VDD.

Exemplarily, referring to FIG. 5 and FIG. 6, the power control end VDD may include a first power end VDDo and a second power end VDDe. Correspondingly, referring to FIG. 7, both the first shift subcircuit 101 and the second shift subcircuit 102 may be respectively connected to the first power end VDDo and the second power end VDDe.

Optionally, each shift subcircuit may include: a pull-down control module and a pull-down module.

Each pull-down control module may be respectively connected to the power control end, a pull-down node, a second pull-down power end, and a pull-up node. Each pull-down control module may output the power control signal to the pull-down node in response to the power control signal, and output a second pull-down power signal to the pull-down node in response to a potential of the pull-up node. A pull-down module in the first shift subcircuit 101 may be respectively connected to the pull-down node in the first shift subcircuit 101, a first pull-down power end, and the first output end. The first shift subcircuit 101 may output a first pull-down power signal to the first output end in response to a potential of the pull-down node in the first shift subcircuit 101. A pull-down module in the second shift subcircuit 102 may be respectively connected to a pull-down node in the second shift subcircuit 102, the first pull-down power end, and the first output end. The second shift subcircuit 102 may output the first pull-down power signal to the second output end in response to a potential of the pull-down node in the second shift subcircuit 102.

Figure 8:
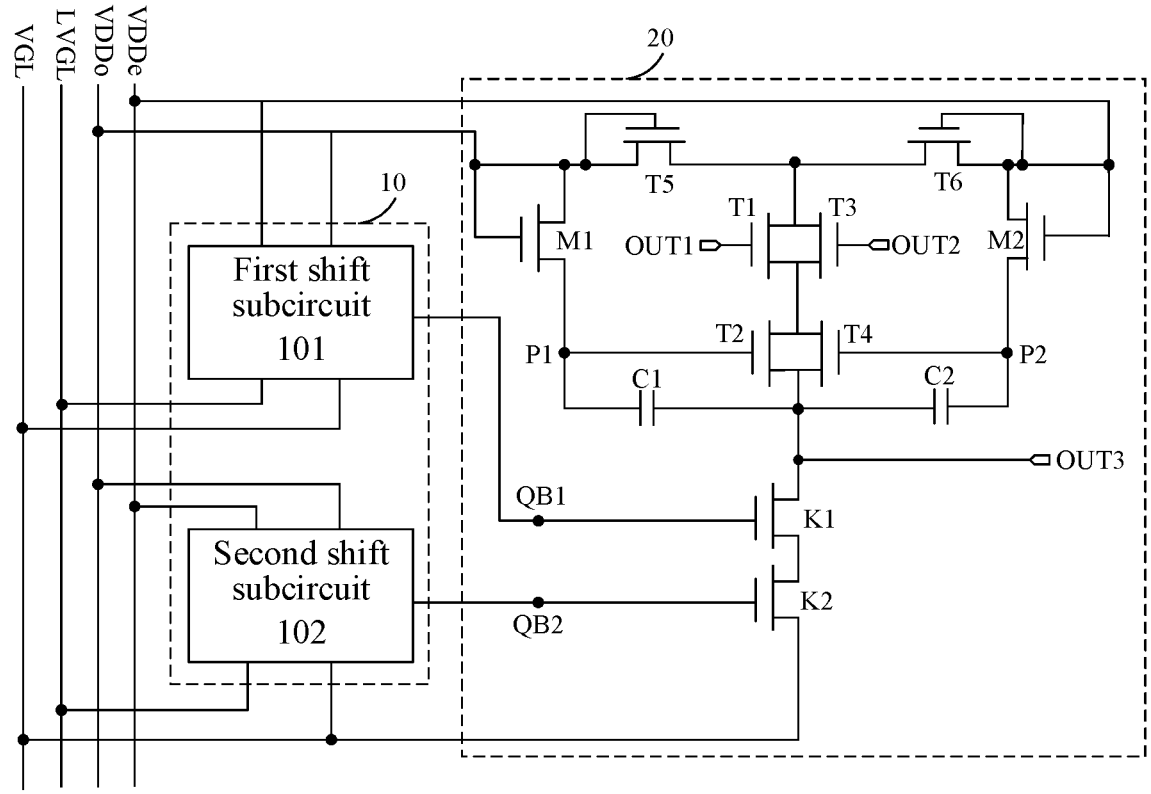
FIG. 8 is a schematic structural diagram of yet another shift register unit according to an embodiment of the present disclosure.
Figure 9:
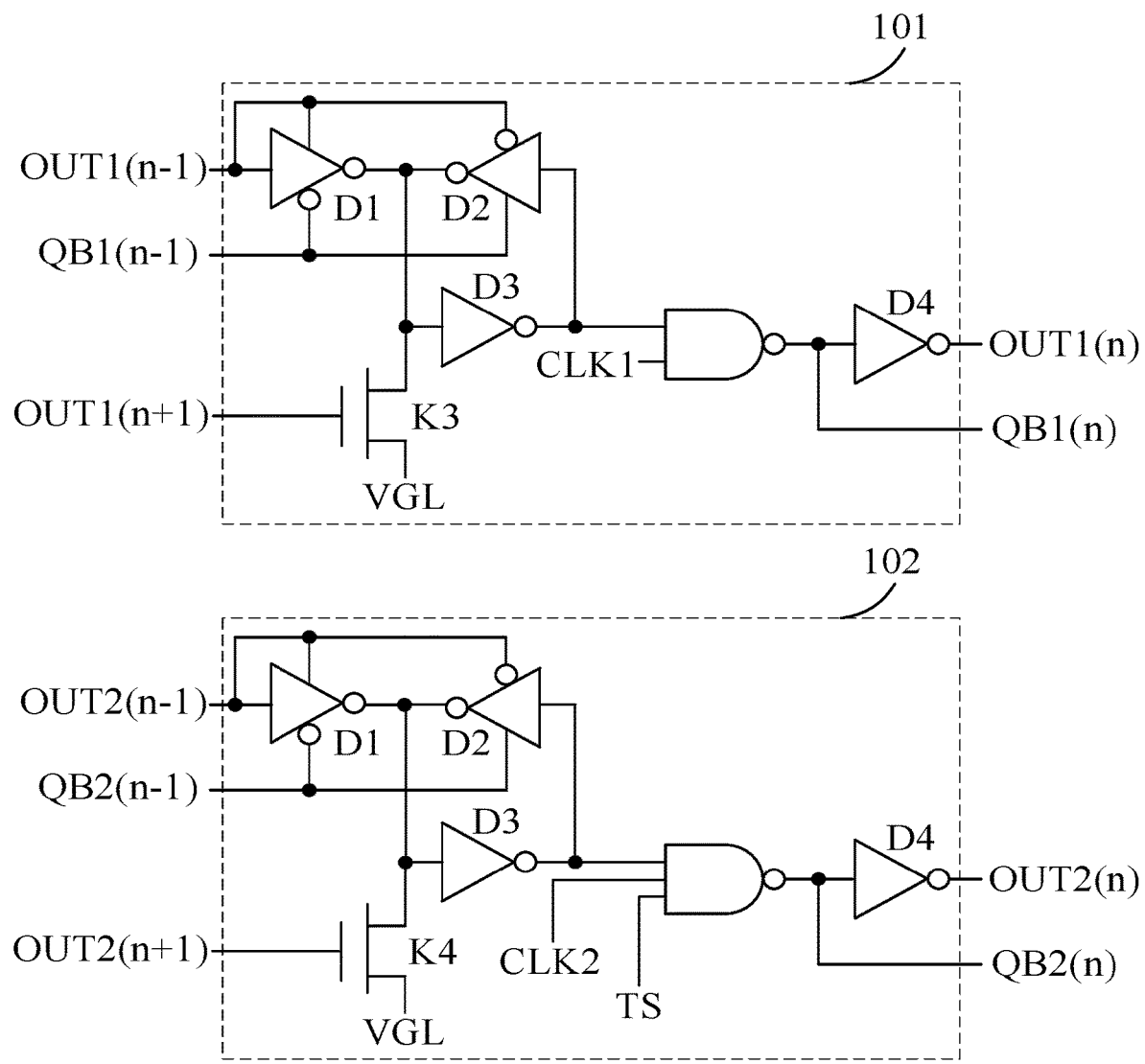
FIG. 9 is a schematic structural diagram of a shift circuit in a shift register unit according to an embodiment of the present disclosure.

Optionally, in this embodiment of the present disclosure, at least some functions of the pull-down control subcircuit 205 in the signal integrated circuit 20 may be implemented by a circuit structure in the shift circuit 10. Exemplarily, FIG. 8 is a schematic structural diagram of yet another shift register unit according to an embodiment of the present disclosure. As shown in FIG. 8, a pull-down subcircuit 206 includes a first pull-down transistor K1 and a second pull-down transistor K2. A first electrode of the first pull-down transistor K1 is connected to a third output end OUT3, a second electrode is connected to a first electrode of the second pull-down transistor K2, and a gate is connected to a first reversed phase output end QB1 (which outputs a signal inverting a signal at a first output terminal OUT1) of a first shift subcircuit 101. A second electrode of the second pull-down transistor K2 is connected to a first pull-down power end VGL, and a gate is connected to a second reversed phase output end QB2 (which outputs a signal inverting a signal at a second output end OUT2) of a second shift subcircuit 102. For example, a first reversed phase output end QB1(n) of an $n^{th}$ level of first shift subcircuit 101 in FIG. 9 is connected to a first output end OUT1(n) of the first shift subcircuit 101 by using a fourth phase inverter D4, and a second reversed phase output end QB2(n) of an $n^{th}$ level of second shift subcircuit 102 is connected to a second output end OUT2(n) of the second shift subcircuit 102 by using the fourth phase inverter D4. Working principles of the circuits shown in FIG. 9 are to be described below with reference to working timing of the circuits. It should be understood that a manner of implementing a shift subcircuit may be not limited only to a circuit structure shown in FIG. 9, and any shift register unit circuit that can provide a signal inverting a signal of an output end in related art may be used to implement the shift subcircuit in the present disclosure.

Because both the first pull-down transistor K1 and the second pull-down transistor K2 are turned on when both the first reversed phase output end QB1 and the second reversed phase output end QB2 output a power control signal (at a high level), at least one of the first pull-down transistor K1 and the second pull-down transistor K2 is always turned off when the first output end OUT1 or the second output end OUT2 outputs the power control signal (at a high level), such that it can be ensured that the third output end OUT3 normally outputs the power control signal. Therefore, a problem that the pull-down subcircuit 206 pulls down the third output end OUT3 may be resolved when the second shift subcircuit 102 outputs the power control signal to the second output end OUT2. Based on this embodiment of the present disclosure, while a structure of the shift register unit is simplified, working reliability of the shift register unit is ensured.

At least some functions of the pull-down control subcircuit 205 in the signal integrated circuit 20 are implemented by a circuit structure in the shift circuit 10, such that a quantity of transistors in the shift register unit may be further reduced while working reliability of a pixel circuit is ensured, in other words, the structure of the shift register unit may be simplified. Correspondingly, manufacturing costs are further reduced, and implementation of a narrow-bezel display device is further facilitated.

Optionally, referring to FIG. 7 and FIG. 8, it may be seen that the first shift subcircuit 101 and the second shift subcircuit 102 may be further respectively connected to the first pull-down power end VGL and the second pull-down power end LVGL. The first shift subcircuit 101 may reset, under control of the first pull-down power end VGL and the second pull-down power end LVGL, the first output signal provided by the first output end OUT1. The second shift subcircuit 102 may reset, under control of the first pull-down power end VGL and the second pull-down power end LVGL, the second output signal provided by the second output end OUT2.

Correspondingly, in this embodiment of the present disclosure, the signal integrated circuit 20 may multiplex a signal cable in the shift circuit 10. For example, referring to FIG. 7 and FIG. 8, the signal integrated circuit 20 may multiplex the first pull-down power end VGL, the second pull-down power end LVGL, the first power end VDDo, and the second power end VDDe in the shift circuit 10. Signal cables that are set may be reduced by multiplexing the signal cable, to facilitate integration of the signal integrated circuit 20 on a display panel.

Optionally, the shift circuit 10 may include only one shift subcircuit. Correspondingly, the one shift subcircuit may be connected to the first output end OUT1 and the second output end OUT2. A specific structure of the shift circuit 10 is not limited in this embodiment of the present disclosure.

It should be noted that, in each of the foregoing embodiments, an example in which each transistor is an N-type transistor and the first potential is a low potential compared with the second potential is used for description. Certainly, each transistor may further use a P-type transistor. When each transistor uses the P-type transistor, the first potential may be a high potential compared with the second potential.

In summary, this embodiment of the present disclosure provides the shift register unit. The shift register unit includes the shift circuit and the signal integrated circuit. The shift circuit may respectively output the power control signal to the first output end and the second output end during an output time period of the gate driving signal during the display scan time period and an output time period of the sensing scan signal during a blank time period. Therefore, the shift circuit may output, to the third output end, a signal integrating the gate driving signal and the sensing scan signal, to implement display and external compensation (for example, a threshold voltage is compensated for by sensing an anode voltage of an organic light emitting diode) functions. In addition, the signal integrated circuit may output the power control signal to a third output end under control of the power control signal and the first output signal which is provided by the first output end, and may output the power control signal to the third output end under control of the power control signal and a second output signal which is provided by the second output end. Therefore, the first output signal and the second output signal may be integrated and output to the third output end, and the third output end outputs an integration signal to one gate line of the drive pixel circuit, thereby ensuring working reliability of the pixel circuit while ensuring external compensation.

FIG. 10 is a flowchart of a method for driving a shift register unit according to an embodiment of the present disclosure. The method may be applied to the shift register unit shown in any one of FIG. 1 to FIG. 8. As shown in FIG. 10, the method includes the following steps:

In a step 901, during a first stage, a potential of a power control signal provided by a power control end is a first potential, a shift circuit outputs the power control signal to a first output end, and a signal integrated circuit outputs the power control signal to a third output end in response to a first output signal provided by the first output end and the power control signal.

In a step 902, during a second stage, the potential of the power control signal is the first potential, both a potential of the first output signal and a potential of a second output signal provided by a second output end are a second potential, the signal integrated circuit outputs, to the third output end in response to the power control signal, the first output signal, and the second output signal, a first pull-down power signal which is from a first pull-down power end, and a potential of the first pull-down power signal is the second potential.

In a step 903, during a third stage, the potential of the power control signal is the first potential, the shift circuit outputs the power control signal to the second output end, and the signal integrated circuit outputs the power control signal to the third output end in response to the second output signal and the power control signal.

In summary, this embodiment of the present disclosure provides the method for driving a shift register unit. The shift circuit may respectively output the power control signal to the first output end and the second output end during an output time period of a gate driving signal during a display scan time period and an output time period of a sensing scan signal during a blank time period. Therefore, the shift circuit may output, to the third output end, a signal integrating the gate driving signal and the sensing scan signal, to implement display and external compensation (for example, a threshold voltage is compensated for by sensing an anode voltage of an organic light emitting diode) functions. In addition, the signal integrated circuit may output the power control signal to the third output end under control of the power control signal and the first output signal which is provided by the first output end, and may output the power control signal to the third output end under control of the power control signal and the second output signal which is provided by the second output end. Therefore, the first output signal and the second output signal may be integrated and output to the third output end, and the third output end outputs an integration signal to one gate line of a drive pixel circuit, thereby ensuring working reliability of the pixel circuit while ensuring external compensation.

In addition, the principle of driving the shift register unit provided in this embodiment of the present disclosure is described by using the shift register unit shown in FIG. 3 as an example, and by using an example in which each transistor in the shift register unit is a N-type transistor, the first potential is a low potential compared with the second potential, and the potential of the power control signal provided by the power control end VDD is the first potential.

Figure 11:
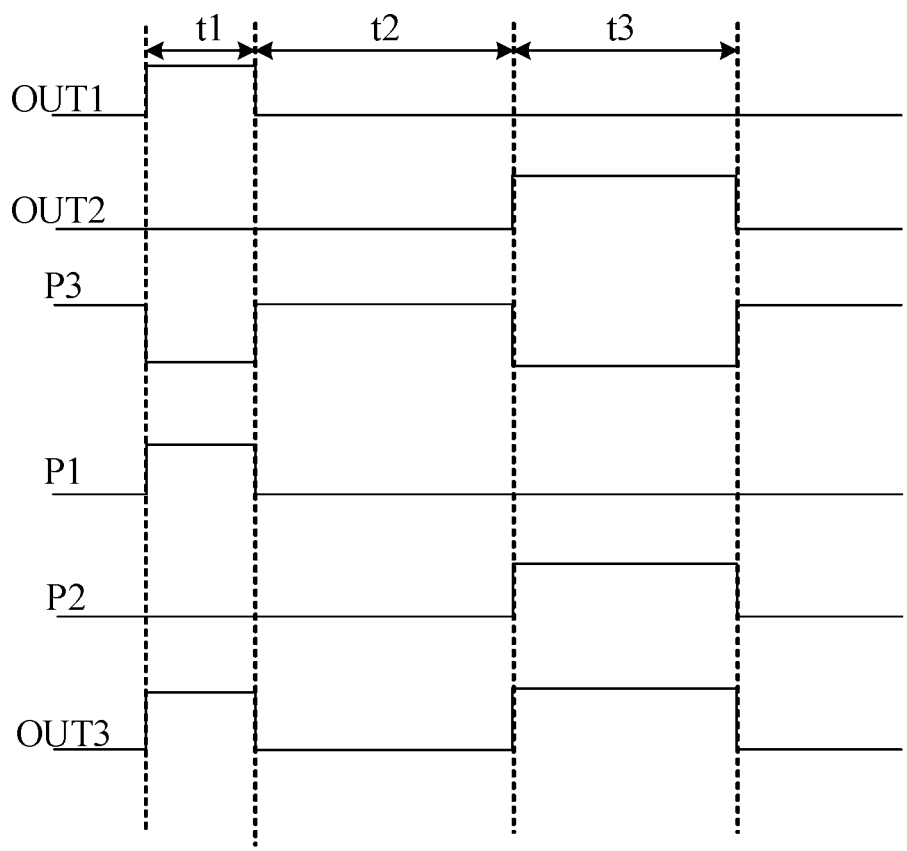
FIG. 11 is a timing diagram of signals of signal ends in a shift register unit according to an embodiment of the present disclosure.

FIG. 11 is a timing diagram of outputting a signal by each signal end in a gate driving circuit according to an embodiment of the present disclosure. As shown in FIG. 11, during a first stage t1, a shift circuit 10 outputs a power control signal during a first potential to a first output end OUT1. A first input transistor M1 and a first output transistor T1 are turned on, a power control end VDD outputs the power control signal at the first potential to a first node P1 by using the first input transistor M1, and a second output transistor T2 is turned on. The power control end VDD outputs the power control signal to a third output end OUT3 by using the first output transistor T1 and the second output transistor T2. In this case, a potential of the first node P1 may be further pulled up based on a self-boost function of a first capacitor C1, and the second output transistor T2 is fully turned on, such that the power control end VDD outputs the power control signal to the third output end OUT3 without a threshold loss. Correspondingly, the third output end OUT3 may output the power control signal at the first potential to one gate line connected to the third output end OUT3, such that a light emitting unit in a drive pixel circuit emits light.

In addition, referring to FIG. 11, at the first stage t1, because the potential of the first output signal provided by the first output end OUT1 is the first potential, a second pull-down control transistor L2 is turned on, and a second pull-down power end LVGL may output a second pull-down power signal at a third potential to a third node P3 by using the second pull-down control transistor L2, such that a pull-down transistor K1 is turned off, thereby ensuring normal output of the third output end OUT3.

During a second stage t2, both the potential of the first output signal provided by the first output end OUT1 and a potential of a second output signal provided by a second output end OUT2 are a second potential. In this case, the first output transistor T1, a third output transistor T3, the second pull-down control transistor L2, and a third pull-down control transistor L3 are all turned off. Because the potential of the power control signal provided by the power control end VDD is the first potential, the first pull-down control transistor L1 is turned on, the power control end VDD outputs the power control signal at the first potential to the third node P3 by using the first pull-down control transistor L1, and the pull-down transistor K1 is turned on. A first pull-down power end VGL outputs a first pull-down power signal at the second potential to the third output end OUT3 by using the pull-down transistor K1, to reset the third output end OUT3.

During a third stage t3, the shift circuit 10 outputs the power control signal at the first potential to the second output end OUT2. a second input transistor M2 and the third output transistor T3 are turned on, the power control end VDD outputs the power control signal at the first potential to the second node P2 by using the second input transistor M2, and a fourth output transistor T4 is turned on. The power control end VDD outputs the power control signal to the third output end OUT3 by using the third output transistor T3 and the fourth output transistor T4. In this case, a potential of the second node P2 may be further pulled up based on a self-boost function of a second capacitor C2, and the fourth output transistor T4 is fully turned on, such that the power control end VDD outputs the power control signal to the third output end OUT3 without a threshold loss. Correspondingly, the third output end OUT3 may output the power control signal at the first potential to one gate line connected to the third output end OUT3, such that a detection transistor in a pixel circuit detects a driving current of a driving transistor, to implement an external compensation function.

In addition, referring to FIG. 11, at the third stage t3, because the potential of the second output signal provided by the second output end OUT2 is the first potential, the third pull-down control transistor L3 is turned on, and the second pull-down power end LVGL may output the second pull-down power signal at the third potential to the third node P3 by using the third pull-down control transistor L3, such that the pull-down transistor K1 is turned off, thereby ensuring normal output of the third output end OUT3.

Optionally, referring to FIG. 11, it may be seen that, a pulse width of the third output end OUT3 at the third stage t3 is greater than a pulse width at the first stage t1, such that it may be ensured that the pixel circuit reliably detect the driving current of the driving transistor during a blank time period under control of a driving signal provided by the third output end OUT3 to the gate line, to perform effective external compensation on the pixel circuit, thereby ensuring a display effect of a display device.

Figure 12:
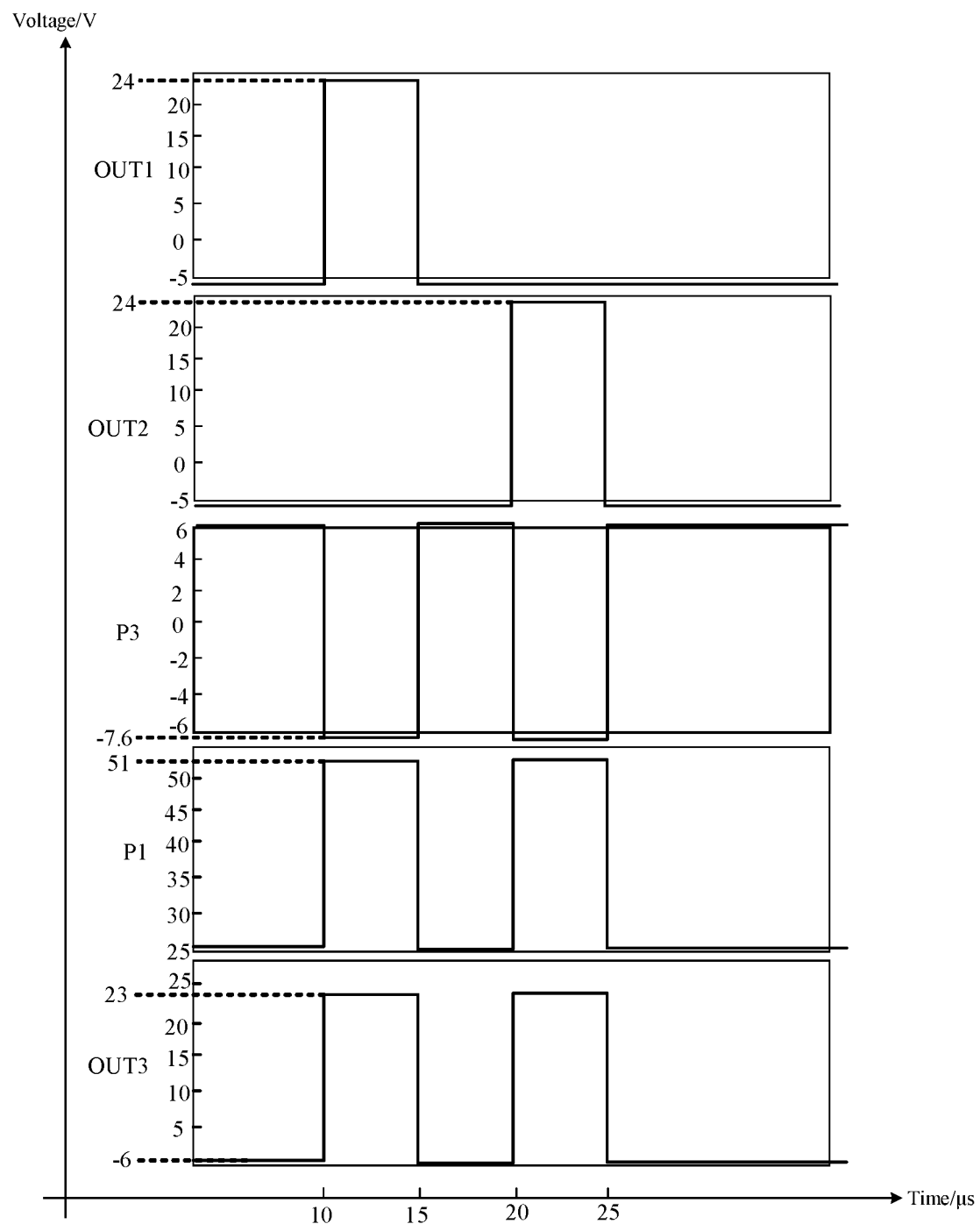
FIG. 12 is a timing simulation diagram of signals of signal ends in a shift register unit according to an embodiment of the present disclosure.

Optionally, FIG. 12 is a timing simulation diagram of signals of signal ends in a shift register unit when the shift register unit shown in FIG. 4 is used as an example. As shown in FIG. 12, a horizontal axis in the timing simulation diagram may mean time (microseconds/µs), and a vertical axis may mean a voltage value (volts/V).

Referring to FIG. 12, it may be seen that, during a time period from a 10 µs to a 15 µs, a power control signal output by the shift circuit 10 to the first output end OUT1 is 24 V. During a time period from a 20 µs to a 25 µs, a power control signal output by the shift circuit 10 to the second output end OUT2 is also 24 V. In addition, during the time period from the 10 µs to the 15 µs and the time period from the 20 µs to the 25 µs, a voltage of the first node P1 may reach 51 V based on a self-boost function of the first capacitor C1, to ensure that the second output transistor T2 may be fully turned on. Correspondingly, it can be ensured that the power control end VDD losslessly outputs the power control signal to the third output end OUT3. For example, referring to FIG. 12, during the time period from the 10 µs to the 15 µs and the time period from the 20 µs to the 25 µs, a voltage of the third output end OUT3 may reach 23 V.

In addition, referring to FIG. 12, it may be further seen that, during the time period from the 15 µs to the 20 µs, a voltage of a first pull-down power signal output by the first pull-down power end VGL to the third output end OUT3 by using the pull-down transistor K1 is −6 V. However, during the time period from the 10 µs to the 15 µs and the time period from the 20 µs to the 25 µs, a potential of a second pull-down power signal output by the second pull-down power end LVGL to the third node P3 by using the second pull-down control transistor L2 or the third pull-down control transistor L3 is −7.6 V. The second pull-down power signal at the lower potential is output to the third node P3, such that it can be ensured that the pull-down transistor K1 is not wrongly turned on, to ensure normal output of the third output end OUT3.

It should be noted that, in each of the foregoing embodiments, an example in which each transistor is an N-type transistor and the first potential is a low potential compared with the second potential is used for description. Certainly, each transistor may further use a P-type transistor. When each transistor uses the P-type transistor, the first potential may be a high potential compared with the second potential.

In summary, this embodiment of the present disclosure provides the method for driving a shift register unit. The shift circuit may respectively output the power control signal to the first output end and the second output end during an output time period of a gate driving signal during a display scan time period and an output time period of a sensing scan signal during a blank time period. Therefore, the shift circuit may output, to the third output end, a signal integrating the gate driving signal and the sensing scan signal, to implement display and external compensation (for example, a threshold voltage is compensated for by sensing an anode voltage of an organic light emitting diode) functions. In addition, the signal integrated circuit may output the power control signal to the third output end under control of the power control signal and the first output signal which is provided by the first output end, and may output the power control signal to the third output end under control of the power control signal and the second output signal which is provided by the second output end. Therefore, the first output signal and the second output signal may be integrated and output to the third output end, and the third output end outputs an integration signal to one gate line of a drive pixel circuit, thereby ensuring working reliability of the pixel circuit while ensuring external compensation.

An embodiment of the present disclosure provides a gate driving circuit. The gate driving circuit may include at least two cascaded shift register units. Each of the shift register units may include: the shift register unit shown in any one of FIG. 1 to FIG. 8.

A third output end OUT3 of each level of shift register unit other than a last level may be connected to a reset signal end of a previous level of shift register unit. A third output end OUT3 of each level of shift register unit other than a first level may be connected to an input signal end of a next level of shift register unit.

In a case in which each shift register unit shown in, for example, FIG. 8 and FIG. 9, includes one first shift subcircuit 101 and one second shift subcircuit 102, a reset end of the first shift subcircuit 101 in any $n^{th}$ level of shift register unit rather than a last level may be connected a first output end OUT1(n+1) of the first shift subcircuit 101 in a next level of shift register unit, and a positive phase input end of the first shift subcircuit 101 in any $n^{th}$ level of shift register unit rather than a first level may be connected a first output end OUT1(n−1) of the first shift subcircuit 101 in a previous level of shift register unit; a reversed phase input end of the first shift subcircuit 101 in any $n^{th}$ level of shift register unit rather than the first level may be connected to a first reversed phase output end QB1(n−1) of the first shift subcircuit 101 in a previous level of shift register unit. A reset end of the second shift subcircuit 102 in any $n^{th}$ level of shift register unit rather than a last level may be connected to a second output end OUT2(n+1) of the second shift subcircuit 102 in a next level of shift register unit, and a positive phase input end of the second shift subcircuit 102 in any $n^{th}$ level of shift register unit rather than a first level may be connected to a second output end OUT2(n−1) of the second shift subcircuit 102 in a previous level of shift register unit; a reversed phase input end of the second shift subcircuit 102 in any $n^{th}$ level of shift register unit rather than the first level may be connected to a second reversed phase output end QB2(n−1) of the second shift subcircuit 102 in the previous level of shift register unit.

Figure 13:
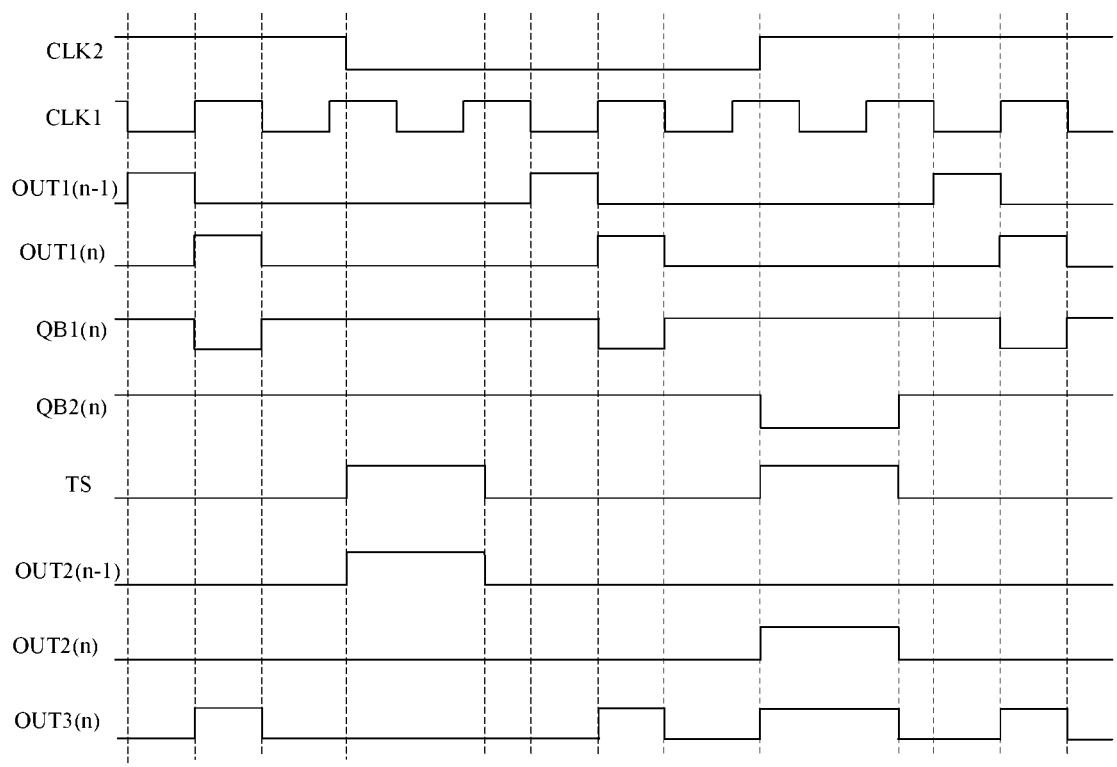
FIG. 13 is a timing diagram of signals of signal ends in a gate driving circuit according to an embodiment of the present disclosure.

FIG. 13 is a timing diagram of signals of signal ends in a gate driving circuit according to an embodiment of the present disclosure. As shown in FIG. 13, a driving signal output by a third output end OUT3(n) of any $n^{th}$ level of shift register unit in the gate driving circuit is a signal obtained by integrating the first output signal and the second output signal. In other words, when a potential of a first output signal output by a first output end OUT1(n) of an $n^{th}$ level of shift register unit is a first potential, a potential of a driving signal output by a third output end OUT3(n) of the $n^{th}$ level of shift register unit is the first potential; when a potential of a second output signal output by a second output end OUT2(n) of the $n^{th}$ level of shift register unit is the first potential, a potential of a driving signal output by a third output end OUT3(n) of the $n^{th}$ level of shift register unit is also the first potential, such that the first output signal and the second output signal are integrated.

Referring to FIG. 9 and FIG. 13, the $n^{th}$ level of current-level shift register unit is used as an example, and the first shift subcircuit 101 shown in FIG. 9 may implement shift output of an input signal based on the following working principle:

When a signal of an $(n-1)^{th}$ level of first output end OUT1(n−1) is switched from a low level to a high level, a first phase inverter D1 resumes working, but a second phase inverter D2 temporarily stops working, and inputs of a NAND gate are respectively from a high level of a third phase inverter D3 and a low level of a first clock signal CLK1. Therefore, output of the NAND gate remains at a high level, such that output of an $n^{th}$ level of first reversed phase output end QB1($n$) remains at a high level, and output of an $n^{th}$ level of first output end OUT1($n$) remains at a low level.

When the signal of the $(n-1)^{th}$ level of first output end OUT1(n-1) is switched from a high level to a low level, the first clock signal CLK1 is switched from a low level to a high level, the first phase inverter D1 temporarily stops working, but the second phase inverter D2 resumes working, and the second phase inverter D2 and the third phase inverter D3 form a latch, to enable output of the third phase inverter D3 to remain at a high level. In this case, inputs of the NAND gate are separately from a high level of the third phase inverter D3 and a high level of the first clock signal CLK1, such that output of the $n^{th}$ level of first reversed phase output end QB1($n$) is switched from a high level to a low level, and output of the $n^{th}$ level of first output end OUT1($n$) is switched from a low level to a high level.

Other cases can be obtained in the same manner. When a signal of an $(n+1)^{th}$ level of first output end OUT1(n+1) is switched from a low level to a high level, a switching transistor K3 is turned on and an internal level of the foregoing latch is inverted, such that output of the third phase inverter D3 is switched from a high level to a low level. In this way, output of the $n^{th}$ level of first reversed phase output end QB1($n$) is switched from a low level to a high level, output of the $n^{th}$ level of first output end OUT1($n$) is switched from a high level to a low level, and such a status remains unchanged until the signal of the $(n-1)^{th}$ level of first output end OUT1(n-1) is switched from a low level to a high level next time.

Referring to FIG. 9 and FIG. 13, the $n^{th}$ level of current-level shift register unit is used as an example, and the second shift subcircuit 102 shown in FIG. 9 may implement shift output of an input signal based on the following working principle:

When a signal of an $(n-1)^{th}$ level of second output end OUT2(n-1) is switched from a low level to a high level, the first phase inverter D1 resumes working, but a second phase inverter D2 temporarily stops working, and inputs of a three-input NAND gate are separately from a high level of the third phase inverter D3, a periodic touch signal TS, and a low level of a second clock signal CLK2. Therefore, output of the NAND gate remains at a high level, such that output of an $n^{th}$ level of first reversed phase output end QB1($n$) remains at a high level, and output of an $n^{th}$ level of second output end OUT2($n$) remains at a low level.

When the signal of the $(n-1)^{t}$ level of second output end OUT2(n-1) is switched from a high level to a low level, a second clock signal CLK2 is switched from a low level to a high level, the first phase inverter D1 temporarily stops working, but the second phase inverter D2 resumes working, and the second phase inverter D2 and the third phase inverter D3 form a latch, to enable output of the third phase inverter D3 to remain at a high level. In this case, inputs of a three-input NAND gate are separately from a high level of the third phase inverter D3, a periodic touch signal TS, and a high level of the first clock signal CLK1, such that output of the $n^{th}$ level of second output end OUT2($n$) is switched from a low level to a high level when the periodic touch signal TS is switched from a low level to a high level, and is switched from a high level to a low level when the periodic touch signal TS is switched from a high level to a low level, and output of the $n^{th}$ level of first reversed phase output end QB1($n$) is switched from a high level to a low level when the periodic touch signal TS is switched from a low level to a high level, and is switched from a low level to a high level when the periodic touch signal TS is switched from a high level to a low level.

Other cases can be obtained in the same manner. When a signal of an $(n+1)^{th}$ level of second output end OUT2(n+1) is switched from a low level to a high level, a switching transistor K4 is turned on and an internal level of the foregoing latch is inverted, such that output of the third phase inverter D3 is switched from a high level to a low level. In this way, output of the $n^{th}$ level of first reversed phase output end QB1($n$) is switched from a low level to a high level, output of the $n^{th}$ level of second output end OUT2($n$) is switched from a high level to a low level, and such a status remains unchanged until the signal of the $(n-1)^{th}$ level of second output end OUT2(n-1) is switched from a low level to a high level next time.

It should be noted that, the circuit timing shown in FIG. 13 is exemplary. Duration between switching the first output end OUT1($n$) from a low level to a high level twice may be equal to a length of one or more display frames, and such duration may be longer than three clock periods of the first clock signal CLK1. Duration between switching the second output end OUT1($n$) from a low level to a high level twice may be equal to a length of one or more display frames, and such duration may be longer than or equal to one clock period of the second clock signal CLK2.

In addition, an embodiment of the present disclosure further provides a display device. The display device may include the gate driving circuit described above. The display device may be: any product or part with a display function, such as electronic paper, an OLED display device, an AMOLED display device, a mobile phone, a tablet computer, a television, a display, a notebook computer, a digital photo frame, or a navigator.

A person skilled in the art may clearly understand that, for convenience and brevity of description, specific working procedures of the described shift register unit and the circuits may be referenced to the corresponding process in the foregoing method embodiments and are no longer described herein.

The descriptions above are only optional embodiments of the present disclosure, but are not intended to limit the present disclosure. Any modifications, equivalent substitutions, improvements and the like made during the spirit and principles of the present disclosure shall all fall during the protection scope of the present disclosure.

What is claimed is:

1. A shift register unit, comprising: a shift circuit and a signal integrated circuit; wherein
the shift circuit is respectively connected to a power control end, a first output end, and a second output end, the shift circuit being used to output, to the first output end during a first time period, a power control signal from the power control end, and the shift circuit being further used to output the power control signal to the second output end during a second time period different from the first time period;
the signal integrated circuit is respectively connected to the power control end, the first output end, the second output end, a first pull-down power end, and a third output end,
the signal integrated circuit being used to output the power control signal to the third output end in response to the power control signal and a first output signal which is provided by the first output end;
the signal integrated circuit is further used to output the power control signal to the third output end in response to the power control signal and a second output signal which is provided by the second output end; and the signal integrated circuit is further used to output, to the third output end at times other than the first time period and the second time period in response to the power control signal, the first output signal and the second output signal, a first pull-down power signal which is from the first pull-down power end.

2. The shift register unit according to claim 1, wherein the first time period is an output time period of a gate driving signal during a display scan time period, and the second time period is an output time period of a sensing scan signal during a blank time period.

3. The shift register unit according to claim 2, wherein the first input subcircuit comprises a first input transistor; the first output subcircuit comprises a first output transistor, a second output transistor and a first capacitor; the second input subcircuit comprises a second input transistor; and the second output subcircuit comprises a third output transistor, a fourth output transistor and a second capacitor; wherein both a gate and a first electrode of the first input transistor are connected to the power control end, and a second electrode of the first input transistor is connected to the first node;

a gate of the first output transistor is connected to the first output end, a first electrode of the first output transistor is connected to the power control end, and a second electrode of the first output transistor is connected to a first electrode of the second output transistor;

a gate of the second output transistor is connected to the first node, and a second electrode of the second output transistor is connected to the third output end;

one end of the first capacitor is connected to the first node, and the other end of the first capacitor is connected to the third output end;

both a gate and a first electrode of the second input transistor are connected to the power control end, and a second electrode of the second input transistor is connected to the second node;

a gate of the third output transistor is connected to the second output end, a first electrode of the third output transistor is connected to the power control end, and a second electrode of the third output transistor is connected to a first electrode of the fourth output transistor;

a gate of the fourth output transistor is connected to the second node, and a second electrode of the fourth output transistor is connected to the third output end; and one end of the second capacitor is connected to the second node, and the other end of the second capacitor is connected to the third output end.

4. The shift register unit according to claim 3, wherein the second input transistor and the first input transistor are the same transistor, the second output transistor and the fourth output transistor are the same transistor, and the second capacitor and the first capacitor are the same capacitor.

5. The shift register unit according to claim 3, wherein the power control end comprises a first power end and a second power end, and a potential of a first power signal provided by the first power end is complementary to a potential of a second power signal provided by the second power end;

the first input subcircuit is respectively connected to the first power end and the first node, and is used to output the first power signal to the first node in response to the first power signal provided by the first power end; the first output subcircuit is respectively connected to the first power end, the first node, the first output end, and the third output end, and is used to output the first power signal to the third output end in response to the potential of the first node and the first output signal; and the second input subcircuit is respectively connected to the second power end and the second node, and is used to output the second power signal to the second node in response to the second power signal provided by the second power end, the second output subcircuit is respectively connected to the second power end, the second node, the second output end, and the third output end, and is used to output the second power signal to the third output end in response to the potential of the second node and the second output signal.

6. The shift register unit according to claim 5, wherein both the gate and the first electrode of the first input transistor are connected to the first power end, and the second electrode of the first input transistor is connected to the first node;

both the gate and the first electrode of the second input transistor are connected to the second power end, and the second electrode of the second input transistor is connected to the second node; and the first output subcircuit further comprises a fifth output transistor, and the second output subcircuit further comprises a sixth output transistor; wherein both a gate and a first electrode of the fifth output transistor are connected to the first power end, and a second electrode of the fifth output transistor is connected to the first electrode of the first output transistor; and both a gate and a first electrode of the sixth output transistor are connected to the second power end, and a second electrode of the sixth output transistor is connected to the first electrode of the third output transistor.

7. The shift register unit according to claim 1, wherein the signal integrated circuit comprises: a first input subcircuit, a first output subcircuit, a second input subcircuit, a second output subcircuit, a pull-down control subcircuit, and a pull-down subcircuit;

the first input subcircuit is respectively connected to the power control end and a first node, and is used to output the power control signal to the first node in response to the power control signal;

the first output subcircuit is respectively connected to the first node, the power control end, the first output end, and the third output end, and is used to output the power control signal to the third output end in response to the first output signal and a potential of the first node;

the second input subcircuit is respectively connected to the power control end and a second node, and is used to output the power control signal to the second node in response to the power control signal;

the second output subcircuit is respectively connected to the second node, the power control end, the second output end and the third output end, and is used to output the power control signal to the third output end in response to the second output signal and a potential of the second node;

the pull-down control subcircuit is respectively connected to the power control end, a third node, the first output end, the second output end and a second pull-down power end, is used to output, to the third node in response to at least one of the first output signal and the second output signal, a second pull-down power signal which is from the second pull-down power end, and is used to output the power control signal to the third node in response to the power control signal; and the pull-down subcircuit is respectively connected to the third node, the first pull-down power end, and the third output end, and is used to output the first pull-down power signal to the third output end in response to a potential of the third node.

8. The shift register unit according to claim 7, wherein the third output end is connected to one gate line, such that the shift register unit outputs a driving signal to the gate line.

9. The shift register unit according to claim 1, wherein the shift circuit comprises a first shift subcircuit and a second shift subcircuit; the first shift subcircuit is respectively connected to the power control end, the first output end, and a first reversed phase output end, the first shift subcircuit is used to output the power control signal to the first output end during the first time period, and output the power control signal to the first reversed phase output end at times other than the first time period; the second shift subcircuit is respectively connected to the power control end, the second output end, and a second reversed phase output end, and the second shift subcircuit is used to output the power control signal to the second output end during the second time period, and output the power control signal to the second reversed phase output end at times other than the second time period;

the signal integrated circuit comprises: a first input subcircuit, a first output subcircuit, a second input subcircuit, a second output subcircuit, a pull-down control subcircuit, and a pull-down subcircuit; the first input subcircuit is respectively connected to the power control end and a first node, and is used to output the power control signal to the first node in response to the power control signal;

the first output subcircuit is respectively connected to the first node, the power control end, the first output end, and the third output end, and is used to output the power control signal to the third output end in response to the first output signal and a potential of the first node;

the second input subcircuit is respectively connected to the power control end and a second node, and is used to output the power control signal to the second node in response to the power control signal;

the second output subcircuit is respectively connected to the second node, the power control end, the second output end, and the third output end, and is used to output the power control signal to the third output end in response to the second output signal and a potential of the second node; and the pull-down subcircuit is respectively connected to the first reversed phase output end, the second reversed phase output end, the first pull-down power end, and the third output end, and is used to output the first pull-down power signal to the third output end when both the first reversed phase output end and the second reversed phase output end output the power control signal.

10. A gate driving circuit, comprising at least two cascaded shift register units according to claim 1; and a third output end of each level of shift register unit other than a last level is connected to an input signal end of a next level of shift register unit, and a third output end of each level of shift register unit other than a first level is connected to a reset signal end of a previous level of shift register unit.

11. The gate driving circuit according to claim 10, wherein the signal integrated circuit comprises: a first input subcircuit, a first output subcircuit, a second input subcircuit, a second output subcircuit, a pull-down control subcircuit, and a pull-down subcircuit;

the first input subcircuit is respectively connected to the power control end and a first node, and is used to output the power control signal to the first node in response to the power control signal;

the first output subcircuit is respectively connected to the first node, the power control end, the first output end, and the third output end, and is used to output the power control signal to the third output end in response to the first output signal and a potential of the first node;

the second input subcircuit is respectively connected to the power control end and a second node, and is used to output the power control signal to the second node in response to the power control signal;

the second output subcircuit is respectively connected to the second node, the power control end, the second output end and the third output end, and is used to output the power control signal to the third output end in response to the second output signal and a potential of the second node;

the pull-down control subcircuit is respectively connected to the power control end, a third node, the first output end, the second output end and a second pull-down power end, is used to output, to the third node in response to at least one of the first output signal and the second output signal, a second pull-down power signal which is from the second pull-down power end, and is used to output the power control signal to the third node in response to the power control signal; and the pull-down subcircuit is respectively connected to the third node, the first pull-down power end, and the third output end, and is used to output the first pull-down power signal to the third output end in response to a potential of the third node.

12. A display device, comprising a gate driving circuit, wherein the gate driving circuit comprises at least two cascaded shift register units, and each of the shift register units comprises a shift circuit and a signal integrated circuit; wherein the shift circuit is respectively connected to a power control end, a first output end, and a second output end, the shift circuit being used to output, to the first output end during a first time period, a power control signal from the power control end, and the shift circuit being further used to output the power control signal to the second output end during a second time period different from the first time period;

the signal integrated circuit is respectively connected to the power control end, the first output end, the second output end, a first pull-down power end, and a third output end, the signal integrated circuit being used to output the power control signal to the third output end in response to the power control signal and a first output signal which is provided by the first output end;

the signal integrated circuit is further used to output the power control signal to the third output end in response to the power control signal and a second output signal which is provided by the second output end; and the signal integrated circuit is further used to output, to the third output end at times other than the first time period and the second time period in response to the power control signal, the first output signal and the second output signal, a first pull-down power signal which is from the first pull-down power end.

13. The display device according to claim 12, wherein the first time period is an output time period of a gate driving signal during a display scan time period, and the second time period is an output time period of a sensing scan signal during a blank time period.

14. The display device according to claim 13, wherein the first input subcircuit comprises a first input transistor; the first output subcircuit comprises a first output transistor, a second output transistor and a first capacitor; the second input subcircuit comprises a second input transistor; and the second output subcircuit comprises a third output transistor, a fourth output transistor and a second capacitor; wherein
both a gate and a first electrode of the first input transistor are connected to the power control end, and a second electrode of the first input transistor is connected to the first node;
a gate of the first output transistor is connected to the first output end, a first electrode of the first output transistor is connected to the power control end, and a second electrode of the first output transistor is connected to a first electrode of the second output transistor;
a gate of the second output transistor is connected to the first node, and a second electrode of the second output transistor is connected to the third output end;
one end of the first capacitor is connected to the first node, and the other end of the first capacitor is connected to the third output end;
both a gate and a first electrode of the second input transistor are connected to the power control end, and a second electrode of the second input transistor is connected to the second node;
a gate of the third output transistor is connected to the second output end, a first electrode of the third output transistor is connected to the power control end, and a second electrode of the third output transistor is connected to a first electrode of the fourth output transistor;
a gate of the fourth output transistor is connected to the second node, and a second electrode of the fourth output transistor is connected to the third output end; and
one end of the second capacitor is connected to the second node, and the other end of the second capacitor is connected to the third output end.

15. The display device according to claim 14, wherein the second input transistor and the first input transistor are the same transistor, the second output transistor and the fourth output transistor are the same transistor, and the second capacitor and the first capacitor are the same capacitor.

16. The display device according to claim 14, wherein the power control end comprises a first power end and a second power end, and a potential of a first power signal provided by the first power end is complementary to a potential of a second power signal provided by the second power end;
the first input subcircuit is respectively connected to the first power end and the first node, and is used to output the first power signal to the first node in response to the first power signal provided by the first power end; the first output subcircuit is respectively connected to the first power end, the first node, the first output end, and the third output end, and is used to output the first power signal to the third output end in response to the potential of the first node and the first output signal; and
the second input subcircuit is respectively connected to the second power end and the second node, and is used to output the second power signal to the second node in response to the second power signal provided by the second power end, the second output subcircuit is respectively connected to the second power end, the second node, the second output end, and the third output end, and is used to output the second power signal to the third output end in response to the potential of the second node and the second output signal.

17. The display device according to claim 16, wherein
both the gate and the first electrode of the first input transistor are connected to the first power end, and the second electrode of the first input transistor is connected to the first node;
both the gate and the first electrode of the second input transistor are connected to the second power end, and the second electrode of the second input transistor is connected to the second node; and
the first output subcircuit further comprises a fifth output transistor, and the second output subcircuit further comprises a sixth output transistor; wherein
both a gate and a first electrode of the fifth output transistor are connected to the first power end, and a second electrode of the fifth output transistor is connected to the first electrode of the first output transistor; and
both a gate and a first electrode of the sixth output transistor are connected to the second power end, and a second electrode of the sixth output transistor is connected to the first electrode of the third output transistor.

18. The display device according to claim 12, wherein the signal integrated circuit comprises: a first input subcircuit, a first output subcircuit, a second input subcircuit, a second output subcircuit, a pull-down control subcircuit, and a pull-down subcircuit;
the first input subcircuit is respectively connected to the power control end and a first node, and is used to output the power control signal to the first node in response to the power control signal;
the first output subcircuit is respectively connected to the first node, the power control end, the first output end, and the third output end, and is used to output the power control signal to the third output end in response to the first output signal and a potential of the first node;
the second input subcircuit is respectively connected to the power control end and a second node, and is used to output the power control signal to the second node in response to the power control signal;
the second output subcircuit is respectively connected to the second node, the power control end, the second output end and the third output end, and is used to output the power control signal to the third output end in response to the second output signal and a potential of the second node;
the pull-down control subcircuit is respectively connected to the power control end, a third node, the first output end, the second output end and a second pull-down power end, is used to output, to the third node in response to at least one of the first output signal and the second output signal, a second pull-down power signal which is from the second pull-down power end, and is used to output the power control signal to the third node in response to the power control signal; and
the pull-down subcircuit is respectively connected to the third node, the first pull-down power end, and the third output end, and is used to output the first pull-down power signal to the third output end in response to a potential of the third node.

19. The display device according to claim 18, wherein the third output end is connected to one gate line, such that the shift register unit outputs a driving signal to the gate line.

20. The display device according to claim 12, wherein the shift circuit comprises a first shift subcircuit and a second shift subcircuit; the first shift subcircuit is respectively connected to the power control end, the first output end, and a first reversed phase output end, the first shift subcircuit is used to output the power control signal to the first output end during the first time period, and output the power control signal to the first reversed phase output end at times other than the first time period; the second shift subcircuit is respectively connected to the power control end, the second output end, and a second reversed phase output end, and the second shift subcircuit is used to output the power control signal to the second output end during the second time period, and output the power control signal to the second reversed phase output end at times other than the second time period;

the signal integrated circuit comprises: a first input subcircuit, a first output subcircuit, a second input subcircuit, a second output subcircuit, a pull-down control subcircuit, and a pull-down subcircuit; the first input subcircuit is respectively connected to the power control end and a first node, and is used to output the power control signal to the first node in response to the power control signal;

the first output subcircuit is respectively connected to the first node, the power control end, the first output end, and the third output end, and is used to output the power control signal to the third output end in response to the first output signal and a potential of the first node;

the second input subcircuit is respectively connected to the power control end and a second node, and is used to output the power control signal to the second node in response to the power control signal;

the second output subcircuit is respectively connected to the second node, the power control end, the second output end, and the third output end, and is used to output the power control signal to the third output end in response to the second output signal and a potential of the second node; and the pull-down subcircuit is respectively connected to the first reversed phase output end, the second reversed phase output end, the first pull-down power end, and the third output end, and is used to output the first pull-down power signal to the third output end when both the first reversed phase output end and the second reversed phase output end output the power control signal.

* * * * *